(12) United States Patent
Takeuchi et al.

(10) Patent No.: US 11,449,575 B2
(45) Date of Patent: Sep. 20, 2022

(54) SOLUTION SEARCH DEVICE AND PROGRAM FOR A BOOLEAN SATISFAIABLITY PROBLEM

(71) Applicant: National University Corporation YOKOHAMA National University, Yokohama (JP)

(72) Inventors: Naoki Takeuchi, Yokohama (JP); Masashi Aono, Yokohama (JP)

(73) Assignee: National University Corporation Yokohama National University, Kanagawa (JP)

( * ) Notice: Subject to any disclaimer, the term of this patent is extended or adjusted under 35 U.S.C. 154(b) by 365 days.

(21) Appl. No.: 16/631,430

(22) PCT Filed: Jul. 19, 2018

(86) PCT No.: PCT/JP2018/026997
§ 371 (c)(1),
(2) Date: Jan. 15, 2020

(87) PCT Pub. No.: WO2019/017412
PCT Pub. Date: Jan. 24, 2019

(65) Prior Publication Data
US 2020/0210515 A1     Jul. 2, 2020

(30) Foreign Application Priority Data
Jul. 19, 2017   (JP) .............................. JP2017-140272

(51) Int. Cl.
*G06F 17/12* (2006.01)
*G06F 17/11* (2006.01)

(52) U.S. Cl.
CPC .............. *G06F 17/12* (2013.01); *G06F 17/11* (2013.01)

(58) Field of Classification Search
CPC .................................. G06F 17/11; G06F 17/12
See application file for complete search history.

(56) References Cited

U.S. PATENT DOCUMENTS

| 6,247,164 B1 * | 6/2001 | Ashar ................. G06F 30/3323 716/106 |
| 2015/0186505 A1 * | 7/2015 | Janssen ................. G06F 30/331 707/711 |

FOREIGN PATENT DOCUMENTS

JP     6029048 B2     11/2016

OTHER PUBLICATIONS

Aono Masahi, "From Natural Computing to Augmented Life", The Journal of the INstitute of Electronic, Information and Communication Engineers, vol. 100, No. 6, pp. 499 to 505, ISSN 0913-5693, Jun. 2017.

(Continued)

*Primary Examiner* — Matthew D Sandifer
(74) *Attorney, Agent, or Firm* — Lee & Hayes, P.C.

(57) ABSTRACT

A solution search device includes a variable value calculation circuit provided for each variable in a conjunctive-normal-form logical expression of an instance of the Boolean Satisfiability problem (SAT) and calculates a value of the variable; and a notification path that notifies another variable value calculation circuit of the value, in which each of the variable value calculation circuit includes a positive-side variable value calculation circuit that calculates a value of a target variable making all clauses including a target variable having no negation among clauses of the logical expression be true, a negative-side variable value calculation circuit that calculates the value of the target variable making all clauses including a target variable having negation among clauses of the logical expression be true, and a current value calculation circuit that calculates the value of (Continued)

the target variable based on the value of the target variable calculated by the positive- side variable value calculation circuit.

11 Claims, 15 Drawing Sheets

(56) References Cited

OTHER PUBLICATIONS

Translation of International Search Report dated Oct. 9, 2018, from corresponding PCT Application No. PCT/JP2018/026997, 2 pages.

* cited by examiner

FIG. 17

SOLUTION SEARCH DEVICE AND PROGRAM FOR A BOOLEAN SATISFAIABLITY PROBLEM

TECHNICAL FIELD

The present invention relates to a solution search device.

Priority is claimed on Japanese Patent Application No. 2017-440272, filed on Jul. 19, 2017, the content of which is incorporated herein by reference.

BACKGROUND ART

Some devices are suggested for solving a combinatorial optimization problem, such as the Boolean Satisfiability problem (SAT), in which it is difficult to search for all solution candidates. For example, PTL 1 discloses a solution search system using quantum dots. In the solution search system, the quantum dots are spatially arranged according to a problem instance of SAT to be solved, and a solution is explored using a light emitting state from the spatially arranged quantum dots.

CITATION LIST

Patent Literature

[PTL 1] Japanese Patent No. 6029048

SUMMARY OF THE INVENTION

Problem to be Solved by the Invention

The solution search system disclosed in PTL 1 is required to change the spatial arrangement of the quantum dots depending on the logical expression of each problem instance of SAT to be solved. However, it is preferable for the system to be able to more generally handle the problem.

The present invention provides a solution search device and a program, which are able to more generally handle the problem.

Means for Solving the Problem

According to an aspect of the present invention, there is provided a solution search device including a variable value calculation circuit that is provided for each variable included in a conjunctive-normal-form logical expression and calculates a value of the variable; and a notification path that notifies another variable value calculation circuit of the value of the variable calculated by the variable value calculation circuit, wherein each of the variable value calculation circuits includes a positive-side variable value calculation circuit that calculates a value of a target variable in a case where a value of another variable calculated by another variable value calculation circuit is input to the logical expression, the target variable being the variable whose value is calculated by the variable value calculation circuit, the value calculated by the positive-side variable value calculation circuit making all clauses including a target variable having no negation among clauses of the logical expression be true, a negative-side variable value calculation circuit that calculates the value of the target variable in a case where a value of another variable calculated by another variable value calculation circuit is input to the logical expression, the value calculated by the negative-side variable value calculation circuit making all clauses including a target variable having negation among clauses of the logical expression be true, and a current value calculation circuit that calculates the value of the target variable based on the value of the target variable calculated by the positive-side variable value calculation circuit, the value of the target variable calculated by the negative-side variable value calculation circuit, and a previous value of the target variable.

The positive-side variable value calculation circuit may include a positive-side clause calculation circuit that outputs true in a case where all literals other than a literal of the target variable are false among literals included in a clause including the target variable having no negation, among the clauses of the logical expression, and outputs false in a case where any one or more literals among the literals other than the literal of the target variable are true among literals included in a clause including the target variable having no negation, among the clauses of the logical expression, and a logical OR calculation circuit that calculates a logical OR of outputs of the positive-side clause calculation circuits corresponding to all the clauses including the target variable having no negation among the clauses of the logical expression.

The positive-side clause calculation circuit may include a selection circuit that selects any one of a value of another variable calculated by another variable value calculation circuit, negation of the value of the other variable, and true according to an aspect of a literal of the other variable in the clause, and a logical NOR calculation circuit that calculates a logical NOR of outputs of all the selection circuits corresponding to all literals included in the clause.

The negative-side variable value calculation circuit may include a negative-side clause calculation circuit that outputs false in a case where all literals other than a literal of the target variable are false among literals included in a clause including the target variable having negation among the clauses of the logical expression, and outputs true in a case where any one or more literals among the literals other than the literal of the target variable are true among literals included in a clause including the target variable having negation among the clauses of the logical expression, and a logical AND calculation circuit that calculates a logical AND of outputs, which correspond to all the clauses including the target variable having negation among the clauses of the logical expression, of the negative-side clause calculation circuit.

The negative-side clause calculation circuit may include the selection circuit, and a logical OR calculation circuit that calculates a logical OR of outputs of all the selection circuits corresponding to all the literals included in the clause.

The solution search device may further include an error circuit that, with a predetermined probability, reverses true and false of at least any one of the value of the target variable calculated by the positive-side variable value calculation circuit and the value of the target variable calculated by the negative-side variable value calculation circuit.

The solution search device may further include a contradiction detection circuit that detects that the value of the target variable calculated by the positive-side variable value calculation circuit and the value of the target variable calculated by the negative-side variable value calculation circuit are incompatible; and a contradiction detection reflection circuit that reflects a detection result of the contradiction detection circuit in another variable value calculation circuit on the calculation of the value of the target variable by the current value calculation circuit.

The solution search device may further include an error circuit that prohibits reflection of the detection result on the calculation of the value of the target variable by the current value calculation circuit with a predetermined probability in a case where the contradiction detection circuit of the other variable value calculation circuit detects that the value of the target variable calculated by the positive-side variable value calculation circuit and the value of the target variable calculated by the negative-side variable value calculation circuit are incompatible.

The program may be program which simulates any of the above-described solution search device.

Advantageous Effects of Invention

According to the above-described solution search device and the program, it is possible to more generally handle a problem.

BRIEF DESCRIPTION OF DRAWINGS

FIG. 17 is a diagram illustrating a second example of the solution search using the solution search device according to the embodiment.

EMBODIMENTS FOR CARRYING OUT THE INVENTION

Hereinafter, although an embodiment of the present invention will be described, the embodiment below does not limit the invention according to claims. In addition, it is not limited that all combinations of characteristics, which are described in the embodiment, are essential to solution means according to the invention.

Figure 1:
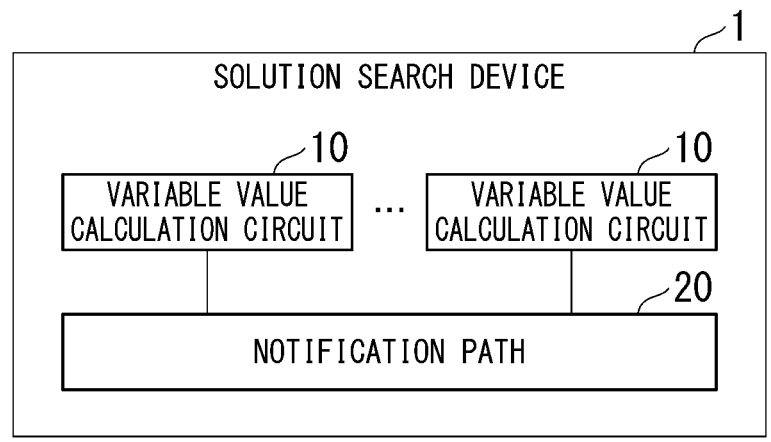
FIG. 1 is a diagram illustrating a schematic configuration of a solution search device according to an embodiment.

FIG. 1 is a diagram illustrating a schematic configuration of a solution search device according to the embodiment. As illustrated in FIG. 1, a solution search device 1 includes a variable value calculation circuit 10 and a notification path 20.

The solution search device 1 searches for a solution to the Boolean Satisfiability problem (SAT). SAT is a nondeterministic polynomial time (NP)-complete problem, and it is possible to deform various NP-complete problems to SAT. Accordingly, in a case where it is possible to solve SAT, it is possible to solve the various NP-complete problems. The variable value calculation circuit 10 calculates a value of a variable in a problem instance of SAT. One variable value calculation circuit 10 is assigned to one variable in the problem instance of SAT. The variable value calculation circuit 10 outputs a signal that represents a value of the assigned variable.

The notification path 20 notifies another variable value calculation circuit 10 of the value of the variable calculated by the variable value calculation circuit 10. Specifically, the notification path 20 delivers the signal output by the variable value calculation circuit 10 to another variable value calculation circuit 10. Therefore, it is possible for each of the variable value calculation circuits 10 to calculate a value of a variable assigned to the variable value calculation circuit 10 by referring to a value of another variable.

The notification path 20 may be capable of delivering the value of the variable, and the notification path 20 is not limited to a specific form. For example, each of the variable value calculation circuits 10 may be configured as a device, and the notification path 20 may be configured as a communication network. Otherwise, the notification path 20 may be configured as a bus of an inside of the solution search device 1. Otherwise, the notification path 20 may be configured as a set of signal lines which connect between the two variable value calculation circuits 10.

Figure 2:
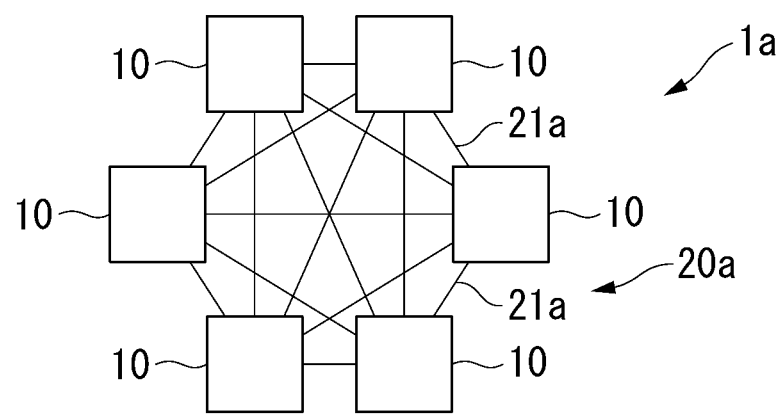
FIG. 2 is a diagram illustrating an example of a first configuration of the solution search device according to the embodiment.

FIG. 2 is a diagram illustrating an example of a first configuration of the solution search device. In the example of FIG. 2, a solution search device 1a includes variable value calculation circuits 10 and a notification path 20a. The solution search device 1a corresponds to an example of the solution search device 1. The notification path 20a corresponds to an example of the notification path 20. Each path which configures the notification path 20a is expressed as an individual path 21a. FIG. 2 illustrates an example of a case where the notification path 20a is configured as a fully connected type. Accordingly, the individual path 21a, which configures the notification path 20a, connects the two variable value calculation circuits 10 in one-to-one manner, and the individual path 21a is provided between all the variable value calculation circuits 10.

According to the configuration illustrated in FIG. 2, it is possible for each of the variable value calculation circuits 10 to refer to the values of the variables calculated by all another variable value calculation circuits 10.

Figure 3:
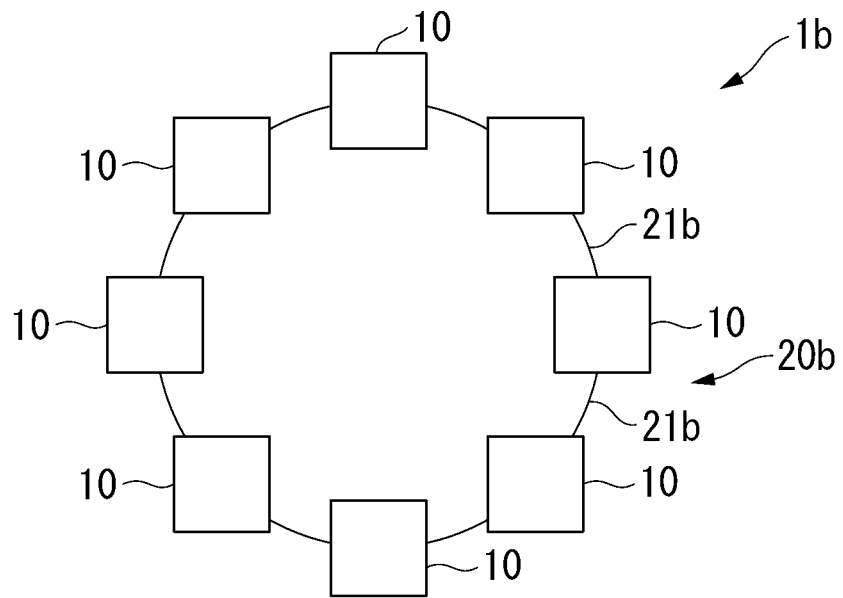
FIG. 3 is a diagram illustrating an example of a second configuration of the solution search device according to the embodiment.

FIG. 3 is a diagram illustrating an example of a second configuration of the solution search device. In the example of FIG. 3, a solution search device 1b includes the variable value calculation circuits 10 and a notification path 20b. The solution search device 1b corresponds to an example of the solution search device 1. The notification path 20b corresponds to an example of the notification path 20. Each path which configures the notification path 20b is expressed as an individual path 21b.

FIG. 3 illustrates an example in a case where the notification path 20b is configured as a ring type.

In the example of FIG. 3, the variable value calculation circuit 10 may transmit a signal from one of two individual paths 21b, which are connected to the variable value calculation circuits 10, to another variable value calculation circuit. Therefore, it is possible for each of the variable value calculation circuits 10 to refer to values of variables calculated by all another variable value calculation circuits 10. Otherwise, in a case of SAT, in which every variable value calculation circuit 10 may refer to only values of variables calculated by the variable value calculation circuits 10 on both sides, it is not necessary for the variable value calculation circuit 10 to transmit a signal from one of the two individual paths 21b to another variable value calculation circuit.

Figure 4:
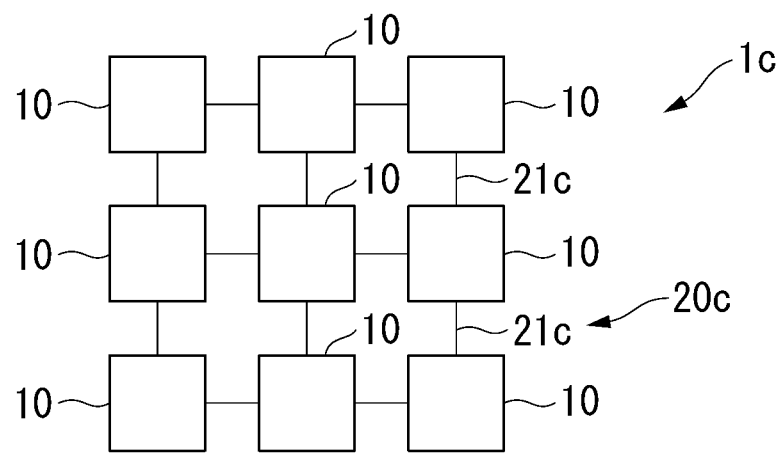
FIG. 4 is a diagram an example of a third configuration of the solution search device according to the embodiment.

FIG. 4 is a diagram an example of a third configuration of the solution search device. In the example of FIG. 4, a solution search device 1c includes the variable value calculation circuits 10 and a notification path 20c. The solution search device 1c corresponds to an example of the solution search device 1. The notification path 20c corresponds to an example of the notification path 20. Each path which configures the notification path 20c is expressed as an individual path 21c.

FIG. 4 illustrates an example in a case where the notification path 20c is configured in a two-dimensional mesh type.

In the example of FIG. 4, the variable value calculation circuit 10 may transmit a signal from one connected individual path 21c to another individual path 21c. Therefore, it is possible for each of the variable value calculation circuits 10 to refer to the values of the variables calculated by all another variable value calculation circuits 10. Otherwise, in a case of SAT, in which every variable value calculation circuits 10 may refer to only values of variables calculated by the adjacent variable value calculation circuit 10, it is not necessary for the variable value calculation circuit 10 to deliver a signal from one individual path 21c to another individual path 21c.

Figure 5:
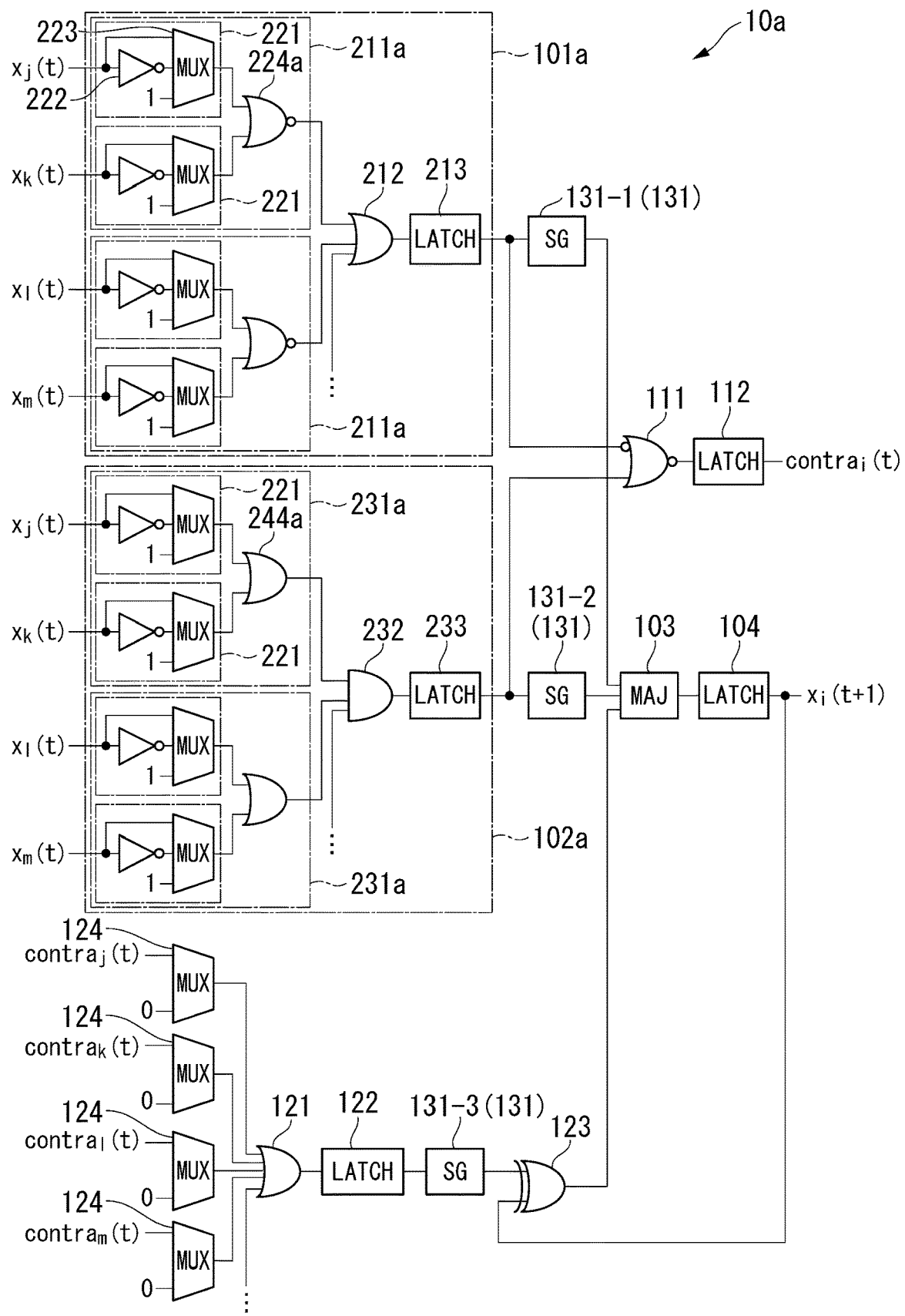
FIG. 5 is a diagram illustrating an example of a configuration of a variable value calculation circuit according to the embodiment.

FIG. 5 is a diagram illustrating an example of a configuration of the variable value calculation circuit. In the example of FIG. 5, a variable value calculation circuit 10a includes a positive-side variable value calculation circuit 101a, a negative-side variable value calculation circuit 102a, a majority decision circuit 103, a variable value latch 104, a contradiction detection circuit 111, a contradiction detection-side latch 112, a contradiction detection merging circuit 121, a reflection-side latch 122, a contradiction detection reflection circuit 123, a multiplexer 124, a positive-side error circuit 131-1, a negative-side error circuit 131-2, and a reflection-side error circuit 131-3. The positive-side error circuit 131-1, the negative-side error circuit 131-2, and the reflection-side error circuit 131-3 are collectively expressed as an error circuit 131.

The error circuit 131 generates errors. Specifically, the error circuit 131 generates the errors by outputting a negation of a input signal with a predetermined probability. In a case where the errors are not generated, the error circuit 131 outputs the input signal as it is. In a case where the error circuit 131 generates the errors, it is possible for the solution search device 1 to search for another solution by escaping from a local solution in a case of falling into the local solution.

The positive-side variable value calculation circuit 101a includes a positive-side clause calculation circuit 211a, a positive-side product circuit 212, and a positive-side latch 213. The positive-side clause calculation circuit 211a includes a literal circuit 221 and a positive-side sum circuit 224a.

The literal circuit 221 includes a NOT circuit 222 and a multiplexer 223.

The negative-side variable value calculation circuit 102a includes a negative-side clause calculation circuit 231a, a negative-side product circuit 232, and a negative-side latch 233. The negative-side clause calculation circuit 231a includes a literal circuit 221 and a negative-side sum circuit 244a.

Hereinafter, an example will be described in which the solution search device searches for a solution to SAT, which determines existence/non-existence of values of variables that cause a value of a conjunctive-normal-form logical expression to be true. The conjunctive-normal-form logical expression is expressed as Equation (1).

$$\prod_{j=1}^{M} \sum_{i=1}^{N} L_i \qquad (1)$$

N indicates the number of variables. $L_i$ indicates a literal of a variable $x_i$. Here, the literal is defined as a variable, a negation of the variable, or a logical value of false. A reason that the false is included in the literal is to uniformly express a case where a certain variable is included in a clause and a case where the variable is not included in the clause. In a case where a certain variable is not included in a certain clause, it is possible to cause a value of a literal to not affect a value of the clause by causing a literal of the variable to be false.

A negation of the variable $x_i$ is expressed as "$\neg x_i$". In addition, a logical value "false" is expressed as "0", and a logical value "true" is expressed as "1".

M indicates the number of clauses. The clause is configured with a logical OR of the literals or one literal, and a logical AND of the clauses configures a conjunctive-normal-form logical expression. The logical OR is expressed as "Σ", "+", or ",".

The logical AND is expressed using "Π" and "•" or by writing the clause in parallel with no operator.

In FIGS. 5 to 9, a variable assigned to a variable value calculation circuit of a description target is expressed as $x_i$, and variables assigned to another variable value calculation circuits are expressed as $x_j, x_k, x_l, x_m, \ldots$. In each of FIGS.

5 to 9, the variable value calculation circuit of the description target is a variable value calculation circuit illustrated in the drawing. As described with reference to FIGS. 1 to 4, the solution search device includes multiple variable value calculation circuits. The variable value calculation circuit is provided for each variable included in the conjunctive-normal-form logical expression and calculates the value of the variable. Each of FIGS. 5 to 9 illustrates one or some of the multiple variable value calculation circuits included in the solution search device. The variable assigned to the variable value calculation circuit of the description target is a variable whose value is calculated by the variable value calculation circuit. The variable assigned to the variable value calculation circuit of the description target is also referred to as a target variable.

The variable value calculation circuit calculates values of all clauses including a literal xi using values of the variables $x_j$, $x_k$, $x_l$, $x_m$, . . . calculated by another variable value calculation circuits, and the variable $x_i$ for which the values of all the clauses including a literal $\neg x_i$ are true. A condition, in which the values of all the clauses including the literal $x_i$ and the values of all the clauses including the literal $\triangleq x_i$ are true, is a necessary condition such that a value of the conjunctive-normal-form logical expression is true. A condition, in which the values of all the clauses included in the conjunctive-normal-form logical expression are true, is a necessary and sufficient condition in which the value of the conjunctive-normal-form logical expression is true.

In addition, in a case where time (clock timing) is illustrated, the time is illustrated by surrounding the time using parenthesis and placing the time at a back of the variable. For example, a value of the variable $x_i$ at time t is expressed as $x_i(t)$.

The variable value calculation circuit $10a$ corresponds to an example of the variable value calculation circuit 10. The variable value calculation circuit $10a$ corresponds to a case where the number of literals included in the clause is three.

Hereinafter, in a case where respective units of the variable value calculation circuit $10a$ are described with reference to FIGS. 5 to 9, there is a case where description is performed using a relationship with the variable value calculation circuit 10. The variable value calculation circuit 10 is a more general variable value calculation circuit which includes the variable value calculation circuit $10a$ as an example.

Each literal circuit 221 receives an input of the value of the variable, and outputs a value of the literal in a case where the multiplexer 223 selects a signal. In a case where the literal indicated by the literal circuit 221 is a variable having no negation, setting is performed such that the multiplexer 223 selects a value of a variable which does not pass through the NOT circuit 222. In a case where the literal indicated by the literal circuit 221 is a variable having negation, setting is performed such that the multiplexer 223 selects a value acquired by performing true-false reversal on the value of the variable by the NOT circuit 222.

The multiplexer 223 selects any one of three signals which are input to the multiplexer 223. In a case where a value of a variable which is input to the literal circuit 221 is set to $x_k(t)$, a value of a signal which is input to the sig multiplexer 223 includes $x_k(t)$, $\neg x_k(t)$, and 1. The multiplexer 223 selects any one of the three signals according to the literal to be associated with the multiplexer 223. Setting of the multiplexer 223 with respect to one problem instance of SAT is fixed. That is, selection of the value of the signal of the multiplexer 223 with respect to one satisfiability problem is fixed.

The multiplexer 223 corresponds to an example of the selection circuit.

The literal circuit 221 corresponds to a case where the number of positive-side clause calculation circuits $211a$ or the number of negative-side clause calculation circuits $231a$ remains. In a case where setting is performed on both the two literal circuits 221 included in the positive-side clause calculation circuit $211a$ such that the multiplexer 223 selects true, the positive-side clause calculation circuit $211a$ outputs false. Therefore, the positive-side clause calculation circuit $211a$ is caused to be non-use, and thus it is possible to prevent the output of the positive-side clause calculation circuit $211a$ from affecting the operation of the positive-side product circuit 212.

In a case where setting is performed on both the two literal circuits 221 included in the negative-side clause calculation circuit $231a$ such that the multiplexer 223 selects true, the negative-side clause calculation circuit $231a$ outputs true. Therefore, the negative-side clause calculation circuit $231a$ is caused to be non-use, and thus it is possible to prevent the output of the negative-side clause calculation circuit $231a$ from affecting the operation of the negative-side product circuit 232.

The positive-side sum circuit $224a$ performs a logical OR operation on the literals in the clause. Specifically, the positive-side sum circuit $224a$ is configured using a NOR circuit, and calculates NOR of a value output by each literal circuit 221. NOR is referred to as a logical NOR, and the NOR circuit is referred to as a logical NOR calculation circuit.

In a case where a value of the clause is true regardless that the value of the variable $x_i$ is true or false, the positive-side sum circuit $224a$ calculates the value of the variable $x_i$ as false. In contrast, in a case where it is necessary that the value of the variable $x_i$ is true such that the value of the clause is true, the positive-side sum circuit $224a$ calculates the value of the variable $x_i$ as true.

The value calculated by the positive-side sum circuit $224a$ is used as a value calculated by the positive-side clause calculation circuit $211a$. One positive-side clause calculation circuit $211a$ corresponds to one clause including the literal $xi$ and calculates the value of the variable $xi$ for which the value of the clause is true.

Specifically, the positive-side clause calculation circuit $211a$ outputs true in a case where all the literals other than the literal of the variable $x_i$ are false among literals included in one clause including the literal $x_i$. The positive-side clause calculation circuit $211a$ outputs false in a case where any one or more literals other than the literal of the variable $x_i$ are true among the literals included in one clause including the literal $x_i$.

The positive-side product circuit 212 performs a logical AND operation for coupling each clause including $x_i$ having no negation. Specifically, the positive-side product circuit 212 acquires OR of the output of the positive-side clause calculation circuit $211a$. In a case where every positive-side clause calculation circuit $211a$ outputs false, the positive-side product circuit 212 outputs false. That is, in a case where the value of the clause is true regardless that the value of the variable $x_i$ is true or false in every clause, the positive-side product circuit 212 outputs false.

In contrast, in a case where one or more positive-side clause calculation circuits $211a$ output true, the positive-side product circuit 212 outputs true. That is, in a case where, in any one or more clauses, it is necessary that the value of the variable $x_i$ is true such that the values of the clauses are true, the positive-side product circuit 212 outputs true.

The positive-side latch 213 temporally holds a value of an output of the positive-side product circuit 212.

The positive-side error circuit 131-1 performs the true-false reversal on an output of the positive-side latch 213 with a predetermined probability. It is possible to perform various setting on an operation of the positive-side error circuit 131-1. For example, only in a case where the output of the positive-side latch 213 is true, the positive-side error circuit 131-1 may perform the true-false reversal with a predetermined probability. Otherwise, only in a case where the output of the positive-side latch 213 is false, the positive-side error circuit 131-1 may perform the true-false reversal with a predetermined probability. In a case where either the output of the positive-side latch 213 is true or false, the positive-side error circuit 131-1 may perform the true-false reversal with a predetermined probability.

The probability that the positive-side error circuit 131-1 performs the true-false reversal may be set to, for example, 5%, that is, a relatively small value.

A signal, which is acquired by causing the output of the positive-side product circuit 212 to be delayed by the positive-side latch 213, becomes the output of the positive-side variable value calculation circuit 101a. The positive-side variable value calculation circuit 101a calculates the value of the variable $x_i$ for which, among clauses of the conjunctive-normal-form logical expression, all the clauses including the variable $x_i$ having no negation become true.

The negative-side sum circuit 244a performs an OR (logical OR) operation of the literals in the clause. Specifically, the negative-side sum circuit 244a is configured using an OR circuit (logical OR calculation circuit), and calculates OR of a value which is output by each of the literal circuits 221.

In a case where the value of the clause becomes true regardless that the value of the variable $x_i$ is true or false, the negative-side sum circuit 244a calculates the value of the variable $x_i$ as true. In contrast, in a case where it is necessary that the value of the variable $x_i$ is false such that the value of the clause becomes true, the negative-side sum circuit 244a calculates the value of the variable $x_i$ as false. That is, in a case where it is necessary that the value of the literal $\neg x_i$ becomes true such that the value of the clause becomes true, the negative-side sum circuit 244a calculates the value of the variable $x_i$ as false.

The value calculated by the negative-side sum circuit 244a is used as a value calculated by the negative-side clause calculation circuit 231a. One negative-side clause calculation circuit 231a corresponds to one clause including the literal $\neg x_i$, and calculates the value of the variable $x_i$, for which the value of the clause becomes true. Specifically, the negative-side clause calculation circuit 231a outputs false in a case where all the literals other than the literal $\neg x_i$ are false among literals included in one clause including the literal $\neg x_i$. The positive-side clause calculation circuit 211a outputs true in a case where any one or more of the literals other than the literal $\neg x_i$ are true among the literals included in one clause including the literal $\neg x_i$.

The negative-side product circuit 232 performs the logical AND operation of coupling each clause including $\neg x_i$. Specifically, the negative-side product circuit 232 acquires AND (logical AND) of the output of the negative-side clause calculation circuit 231a. The negative-side product circuit 232 is configured using an AND circuit (logical AND calculation circuit). In a case where every negative-side clause calculation circuit 231a outputs true, the negative-side product circuit 232 outputs true. That is, in a case where, in every clause, the value of the clause becomes true regardless that the value of the variable $x_i$ is true or false, the negative-side product circuit 232 outputs true. In contrast, in a case where one or more negative-side clause calculation circuits 231a output false, the negative-side product circuit 232 outputs false. That is, in a case where, in any of one or more clauses, it is necessary that the value of the variable $x_i$ is false (the value of literal $\neg x_i$ is true) such that the value of the clause becomes true, the negative-side product circuit 232 outputs false.

The negative-side latch 233 temporally holds a value of an output of the negative-side product circuit 232.

The negative-side error circuit 131-2 performs true-false reversal on an output of the negative-side latch 233 with a predetermined probability. It is possible to perform various setting on an operation of the negative-side error circuit 131-2. For example, only in a case where the output of the negative-side latch 233 is true, the negative-side error circuit 131-2 may perform the true-false reversal with a predetermined probability. Otherwise, only in a case where the output of the negative-side latch 233 is false, the negative-side error circuit 131-2 may perform the true-false reversal with a predetermined probability. Regardless that the output of the negative-side latch 233 is true or false, the negative-side error circuit 131-2 may perform the true-false reversal with a predetermined probability.

The probability that the negative-side error circuit 131-2 performs the true-false reversal may be set to, for example, 5%, that is, a relatively small value.

A signal, which is acquired by delaying the output of the negative-side product circuit 232 by the negative-side latch 233, is an output of the negative-side variable value calculation circuit 102a. The negative-side variable value calculation circuit 102a calculates the value of the variable $x_i$ for which, among the clauses of the conjunctive-normal-form logical expression, all the clauses including the variable $x_i$ ($\neg x_i$) having negation become true.

The majority decision circuit 103 calculates a value of a variable $x_i(t+1)$ based on an output (value of the variable $x_i(t)$) of the majority decision circuit 103, the output of the positive-side variable value calculation circuit 101a, and the output of the negative-side variable value calculation circuit 102a. The majority decision circuit 103 corresponds to an example of a current value calculation circuit. The value of the variable $x_i(t)$ corresponds to an example of a previous value of the target variable.

The variable value latch 104 holds the output of the majority decision circuit 103 for one clock period. The variable value calculation circuit outputs the value of the variable $x_i$ at time t+1 which is a subsequent clock period with respect to an input of a value of another variable at time t. The value of the variable is expressed as $x_i(t+1)$. "t+1" of "$x_i(t+1)$" indicates timing t+1 which is timing of the subsequent clock period of the timing t Accordingly, the value of the variable $x_i$ is the value of the variable $x_i(t)$ at timing t, and is the value of the variable $x_i(t+1)$ at the subsequent timing t+1.

For simple description of the majority decision circuit 103, a case is considered where the true-false reversal is not performed on both the positive-side error circuit 131-1 and the negative-side error circuit 131-2 and the output of the variable value latch 104 is input to the majority decision circuit 103 as it is.

In this case, the majority decision circuit 103 determines whether or not to change the value of the variable $x_i$ ($x_i(t+1)$) from the previous value ($x_i(t)$) based on the output of the positive-side variable value calculation circuit 101a and the output of the negative-side variable value calculation circuit 102a.

In a case where both the output of the positive-side variable value calculation circuit 101a and the output of the negative-side variable value calculation circuit 102a are false, it is necessary that the value of the variable $x_i$ is false such that both the value of the clause including the literal $x_i$ and the value of the clause including the literal $\neg x_i$ become true. In this case, the majority decision circuit 103 causes the value of the variable $x_i$ to be false.

In contrast, in a case where both the output of the positive-side variable value calculation circuit 101a and the output of the negative-side variable value calculation circuit 102a are true, it is necessary that the value of the variable $x_i$ is true such that value of the clause including the literal $x_i$ and the value of the clause including the literal $\neg x_i$ become true. In this case, the majority decision circuit 103 causes the value of the variable $x_i$ to be true.

In other cases, the majority decision circuit 103 holds the previous value of the variable $x_i$.

The number and the locations of the error circuits 131 in FIG. 5 are examples. The number and the locations of the error circuits 131 included in the variable value calculation circuit 10a are not limited to the examples, and various number and locations are possible.

For example, there is a case where the solution search is performed even in a case of a configuration in which the variable value calculation circuit 10a does not include some or the whole of the error circuit 131 illustrated in FIG. 5, e.g., a configuration in which the variable value calculation circuit 10a does not include the positive-side error circuit 131-1 and the negative-side error circuit 131-2.

In addition, the error circuits 131 may be provided at the back of the variable value latch 104. In this case, all the three error circuits 131 illustrated in FIG. 5 may remain or a configuration may be provided in which some or the whole of the three error circuits 131 are removed.

FIG. 5 illustrates five latches including the variable value latch 104, the contradiction detection-side latch 112, the reflection-side latch 122, the positive-side latch 213, and the negative-side latch 233. The number and the locations of the latches are examples, the number and the locations of the latches included in the variable value calculation circuit 10a are not limited to the examples, and various number and locations are possible. For example, according to a magnitude of delay in each logic gate and each multiplexer, there is a case where it is possible to calculate the value of the variable at appropriate timing even in a case of a configuration in which the variable value calculation circuit 10a does not include some or the whole of the five latches illustrated in FIG. 5.

In addition, a latch configuration method included in the variable value calculation circuit 10a is not limited to a specific configuration method, and it is possible to configure the latches using various circuits which are capable of holding an input value. For example, some or the whole of the latches included in the variable value calculation circuit 10a may be configured using a flip-flop.

Figure 6:
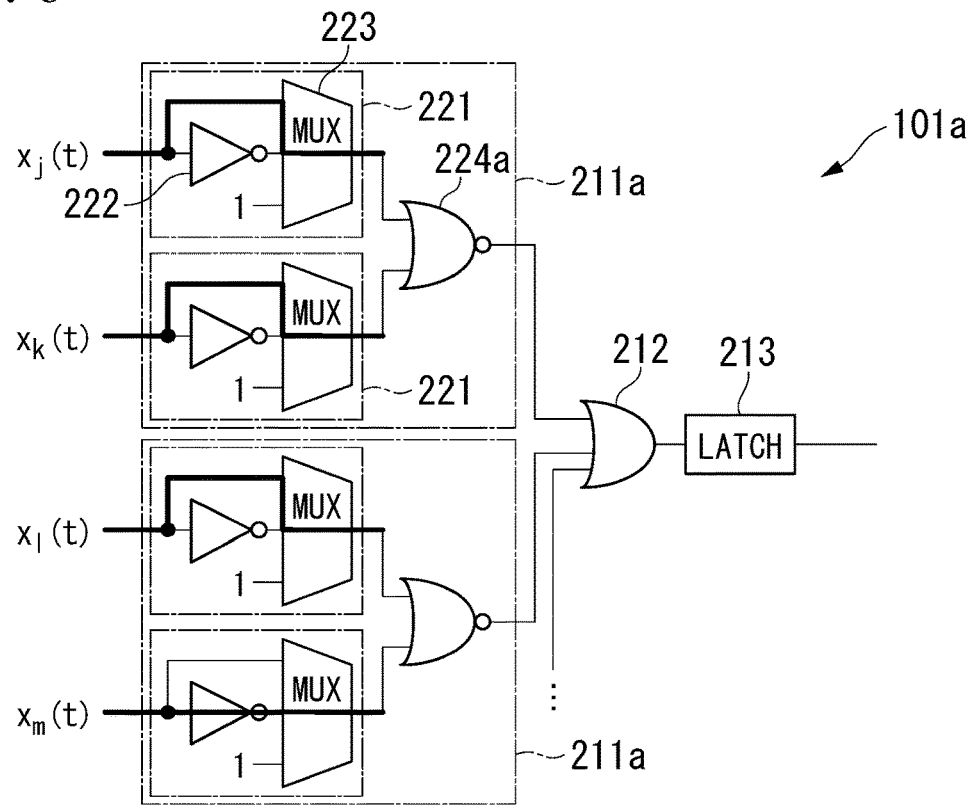
FIG. 6 is a diagram illustrating an example of setting of a multiplexer in a positive-side clause calculation circuit according to the embodiment.

FIG. 6 is a diagram illustrating an example of setting of the multiplexer 223 in the positive-side clause calculation circuit 211a. For example, in a case where a clause $(x_i+x_j+x_k)$ and a clause $(x_i+x_l+\neg x_m)$ are included in a logical expression, a path of the signal is formed by performing setting of signal selection by the multiplexer 223 as illustrated in FIG. 6. In this case, the two positive-side clause calculation circuits 211a respectively calculate $\neg(x_j+x_k)$ and $\neg(x_l+\neg x_m)$.

In a necessary and sufficient condition in which a value of the clause $(x_i+x_j+x_k)$ becomes true, one or more values of $x_i$, $x_j$, and $x_k$ become true. Accordingly, in a case where one or more values of $x_j$ and $x_k$ are true, the value of $x_i$ may be either true or false. In contrast, in a case where both the values of $x_j$ and $x_k$ are false, it is necessary that the value of $x_i$ is true. In this manner, in a clause including the variable $x_i$ having no negation, the value of the variable xi may be any one of true, false, or necessity to be true.

As described above, in the positive-side clause calculation circuit, in a case where the value of the variable $x_i$ may be either true or false, the value of the variable $x_i$ is set to false. In a case where it is necessary that the value of the variable $x_i$ is true, the value of the variable $x_i$ is set to true. The value of the variable $x_i$ is calculated using $\neg(x_j+x_k)$ operated by the positive-side clause calculation circuit 211a.

In addition, in a necessary and sufficient condition in which a value of a clause $(x_i+x_l+\neg x_m)$ becomes true, one or more values of $x_i$, $x_l$, and $\neg x_m$ and become true. Accordingly, in a case where one or more values of $x_l$ and $\neg x_m$ are true, the value of $x_i$ may be either true or false. In contrast, in a case where both the values of $x_l$ and $\neg x_x$ are false, it is necessary that the value of $x_i$ is true.

As described above, in the positive-side clause calculation circuit, in a case where the value of the variable $x_i$ may be either true or false, the value of the variable $x_i$ is set to false. In a case where it is necessary that the value of the variable $x_i$ is true, the value of the variable $x_i$ is set to true. The value of the variable $x_i$ is calculated using $\neg(x_l+\neg x_m)$ calculated by the positive-side clause calculation circuit 211a.

Figure 7:
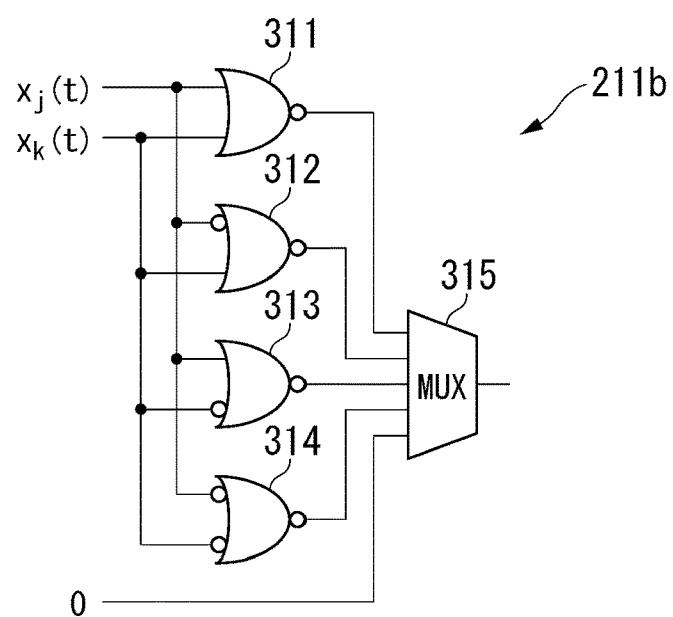
FIG. 7 is a diagram illustrating an example of another configuration of the positive-side clause calculation circuit according to the embodiment.

FIG. 7 is a diagram illustrating an example of another configuration of the positive-side clause calculation circuit. A positive-side clause calculation circuit 211b illustrated in FIG. 7 includes four logic gates 311 to 314 and a multiplexer 315.

In a case where setting is performed such that multiplexer 315 selects any of outputs of the four logic gates 311 to 314 according to whether or not each of the variables $x_j$ and $x_k$ has negation in the clause, the positive-side clause calculation circuit 211b becomes a circuit equivalent to the positive-side clause calculation circuit 211a. Here, the equivalent circuit is a circuit which outputs the same value with respect to the same input value. In a case where the positive-side clause calculation circuit 211b is caused to be non-use, setting is performed such that the multiplexer 315 selects false.

Figure 8:
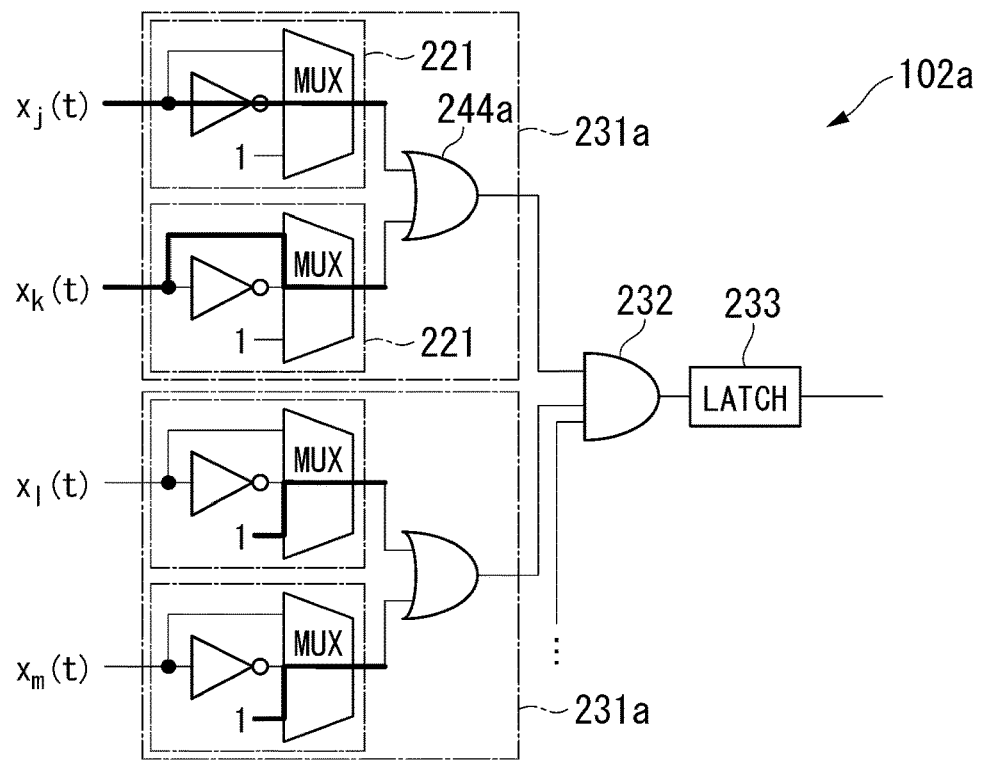
FIG. 8 is a diagram illustrating an example of setting of a multiplexer in a negative-side clause calculation circuit according to the embodiment.

FIG. 8 is a diagram illustrating an example of setting of the multiplexer 223 of the negative-side clause calculation circuit 231a.

For example, in a case where a clause $(\neg x_i+\neg x_j+x_k)$ is included in the logical expression, a signal path is formed by performing setting of the signal selection by the multiplexer 223 as in FIG. 8. The negative-side clause calculation circuit 231a (the negative-side clause calculation circuit 231a on a lower side of FIG. 8), which receives inputs of the values of the variables $x_l$ and $x_m$, is caused to be non-use.

In this case, the negative-side clause calculation circuit 231a (negative-side clause calculation circuit 231a on an upper side of FIG. 8), which receives inputs of the values of the variables $x_j$ and $x_k$, calculates $\neg x_j+x_k$.

In a necessary and sufficient condition in which a value of the clause $(\neg x_i+\neg x_j+x_k)$ becomes true, values of one or more of $\neg x_i$, $\neg x_j$, and $x_k$ become true. Accordingly, in a case where one or more values of $\neg x_j$ and $x_k$ are true, the value of $x_i$ may be either true or false. In contrast, in a case where both values of $\neg x_j$ and $x_k$ are false, it is necessary that the value of $\neg x_i$ is true. Accordingly, it is necessary that the value of $x_i$ is false.

In this manner, in the clause including the variable $x_i$ having no negation, the value of the variable $x_i$ may be any one of true, false, or necessity to be false.

As above, in the negative-side clause calculation circuit, in a case where the value of the variable $x_i$ may be either true or false, the value of the variable $x_i$ is set to true. In a case where it is necessary that the value of the variable $x_i$ false, the value of the variable $x_i$ is set to false. The value of the variable $x_i$ is calculated using $\neg x_j + x_k$ calculated by the negative-side clause calculation circuit 231a.

Figure 9:
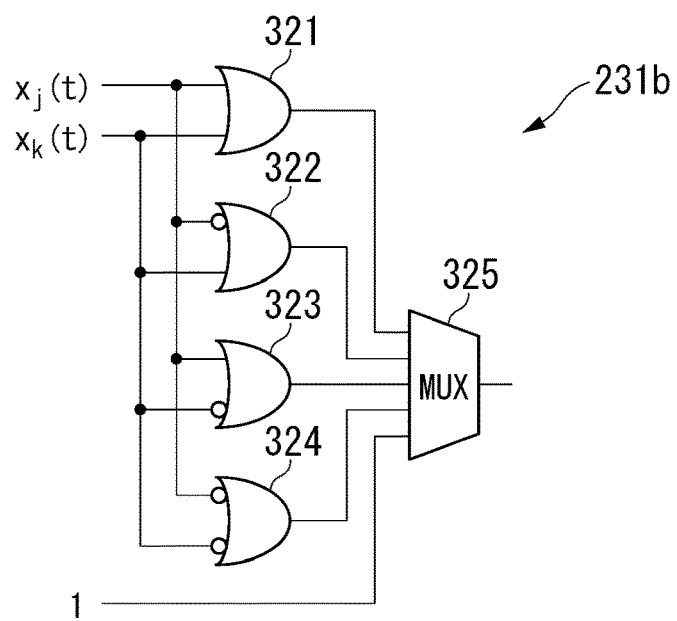
FIG. 9 is a diagram illustrating an example of another configuration of the negative-side clause calculation circuit according to the embodiment.

FIG. 9 is a diagram illustrating an example of another configuration of the negative-side clause calculation circuit. A negative-side clause calculation circuit 231b illustrated in FIG. 7 includes four logic gates 321 to 324 and a multiplexer 325.

In a case where setting is performed such the multiplexer 325 selects any of outputs from the four logic gates 321 to 324 according to whether or not the respective variables $x_j$ and $x_k$ have negation in the clause, the negative-side clause calculation circuit 231b becomes a circuit equivalent to the negative-side clause calculation circuit 231a.

In a case where the negative-side clause calculation circuit 231b is caused to be non-use, setting is performed such that the multiplexer 325 selects true.

The contradiction detection circuit 111 of FIG. 5 detects a state in which the output of the positive-side variable value calculation circuit 101a and the output of the negative-side variable value calculation circuit 102a are contradictive. That is, the contradiction detection circuit 111 detects the value of the variable $x_i$ calculated by the positive-side variable value calculation circuit 101a and the value of the variable $x_i$ calculated by the negative-side variable value calculation circuit 102a are incompatible.

Specifically, in a case where the output of the positive-side variable value calculation circuit 101a indicates a fact that it is necessary that the value of the variable is true and the output of the negative-side variable value calculation circuit 102a indicates a fact that it is necessary that the value of the variable is false, it is not possible to establish the both values. The contradiction detection circuit 111 detects the state.

A detection result of the contradiction detection circuit 111 is used to change a value of an output of another variable value calculation circuit 10. Therefore, the notification path 21 notifies another variable value calculation circuit 10 of the detection result of the contradiction detection circuit 111 in addition to the value of the variable calculated by the variable value calculation circuit 10. The detection result of the contradiction detection circuit 111 is also referred to as a contradiction detection result. Another variable value calculation circuit 10 may be the variable value calculation circuit 10a or may be a variable value calculation circuit 10b or 10c which will be described later.

The contradiction detection-side latch 112 holds the output of the contradiction detection circuit 111 for one clock period.

A value of an output, which is associated with the variable $x_i$, of the contradiction detection circuit 111 of the variable value calculation circuit 10 at time t, is expressed as $contra_i(t)$.

In the example of FIG. 5, as in "$contra_i(t)$" and "$x_i(t+1)$", output timing of $contra_i$ to another variable value calculation circuit is one clock before output timing of $x_i$. However, the output timing of the $contra_i$ is not limited thereto. For example, in experiments, a fact is checked that it is possible for the solution search device 1 to solve SAT even though $contra_i$ is output while being delayed by a few number of clocks with respect to $x_i$. Accordingly, "$contra_i(t+1)$" or "$contra_i(t+2)$" may be acquired instead of "$contra_i(t)$" of FIG. 5.

In addition, in experiments, a fact is checked that there is a case where an output of $contra_i$, which is delayed rather than time t, causes the variable value calculation circuit of an output destination of $contra_i$ to easily synchronize $contra_i$ with another signal.

The output timing of "$contra_i(t)$" in an example of another drawing is the same as the case of FIG. 5.

Among contradiction detection results notified from another variable value calculation circuit 10, the multiplexer 124 causes a contradiction detection result of a variable, which shares the clause with the variable assigned to the variable value calculation circuit 10 (in the example of FIG. 5, the variable value calculation circuit 10a) including the multiplexer 124. In contrast, the multiplexer 124 replaces a contradiction detection result of a variable, which does not share the clause with the variable assigned to the variable value calculation circuit 10 including the multiplexer 124, by false.

As described above, the variable assigned to the variable value calculation circuit 10 is a variable whose value of which is calculated by the variable value calculation circuit 10.

A fact that multiple variables share the clause indicates that multiple variables are included in the same clause. Each of the variables may be included in the clause in a form of having no negation ($\neg$) or may be included in the clause in a form of having negation. In the embodiment, SAT of the conjunctive-normal-form logical expression is treated. In this case, the fact that multiple variables shares the clause indicates that at least one clause which includes the multiple variables exists among the clauses of the logical expression of SAT.

In order to cause the multiplexer 124 to operate as above, it is possible to previously perform setting of the signal selection by the multiplexer 124 for each multiplexer 124 according to the logical expression of SAT.

In a case of FIG. 5, the variable value calculation circuit 10a in the drawing calculates the value of the variable $x_i$. Accordingly, each of the multiplexers 124 illustrated in FIG. 5 causes the contradiction detection result to pass therethrough as it is in a case where a variable, which is a target of the contradiction detection result to be input to the multiplexer 124, shares the clause with the variable $x_i$. In contrast, each of the multiplexer 124 outputs false instead of the contradiction detection result in a case where the variable, which is the target of the contradiction detection result to be input to the multiplexer 124, does not share the clause with the variable xi.

For example, the multiplexer 124, to which the $contra_j(t)$ is input, is previously set to output a value of $contra_j(t)$ in a case where the variable $x_i$ and the variable $x_j$ share the clause. In contrast, in a case where the variable $x_i$ and the variable $x_j$ do not share the clause, the multiplexer 124, to which the $contra_j(t)$ is input, is previously set to output false (logic 0).

In a case where a calculation result of a value of a certain variable is contradictive, the contradiction detection result is used to solve a contradiction state by changing a value of another variable. Specifically, in a case where calculation is performed such that the value of the certain variable should be true and false, the contradiction detection result is used to solve the contradiction state of true and false by performing true-false reversal on true and false of the value of another variable.

In contrast, even though a value of a variable which does not share the clause with the variable whose value is contradictive, the contradiction state is not solved. However, it is considered that there is a high possibility that the value of the variable goes away from a solution in a case where the value of the variable is changed from a calculated value.

Here, as above, the multiplexer 124 replaces the contradiction detection result of the variable, which does not share the clause with the variable assigned to the variable value calculation circuit 10 that includes the multiplexer 124, by false. Therefore, the variable value calculation circuit 10 ignores the contradiction detection result of the variable, which does not share the clause with a variable whose value is calculated from the variable value calculation circuit 10. Therefore, it is possible for the variable value calculation circuit 10 to change a value of a variable which does not contribute to solve the contradiction state and to avoid going away from the solution due to the change.

The contradiction detection merging circuit 121 colligates a contradiction detection result notified from another variable value calculation circuits 10. Specifically, the contradiction detection merging circuit 121 acquires OR of a signal of the contradiction detection result notified from another variable value calculation circuits 10. In a case where any of the variable value calculation circuits 10 detects a contradiction, the contradiction detection merging circuit 121 outputs 1. In a case where no variable value calculation circuit 10 detects the contradiction, the contradiction detection merging circuit 121 outputs 0.

The reflection-side latch 122 holds the output of the contradiction detection merging circuit 121 for one clock period.

The reflection-side error circuit 131-3 performs true-false reversal on the contradiction detection result with a predetermined probability. For example, in a case where an output of the reflection-side latch 122 is false, the reflection-side error circuit 131-3 may output false as it is. In addition, in a case where the output of the reflection-side latch 122 is true, the reflection-side error circuit 131-3 may reverse the output of the reflection-side latch 122 with, for example, a probability of 90%.

In this manner, in a case where the contradiction detection circuit 111 in another variable value calculation circuit detects that the value of the target variable calculated by the positive-side variable value calculation circuit 101a and the value of the target variable calculated by the negative-side variable value calculation circuit 102a are incompatible, the error circuit 131-3 may suppress reflection of the detection result on the calculation of the value of the variable $x_i$ by the majority decision circuit 103 with a predetermined probability.

The contradiction detection reflection circuit 123 performs a logical XOR on the contradiction detection result and an output from the variable value latch 104. Therefore, in a case where the contradiction detection result is 1 indicative of contradiction, the contradiction detection reflection circuit 123 causes the output from the variable value latch 104 to have negation, and outputs the output having negation. Therefore, it is easy for the majority decision circuit 103 to output a value which is different from a previous value. In this manner, the contradiction detection reflection circuit 123 reflects the detection result of the contradiction detection circuit 111 in another variable value calculation circuit 10 on calculation of the value of the variable $x_i$ by the majority decision circuit 103.

In a case where the contradiction detection reflection circuit 123 is used, updating of the value of the variable is promoted in a case where contradiction is detected by any of the variable value calculation circuits 10, and thus it is expected that it is possible to rapidly solve a state in which the contradiction occurs.

Subsequently, an example of a configuration of the variable value calculation circuit in a case where the number of literals included in the clause is not limited to three will be described with reference to FIGS. 10 to 14.

Figure 10:
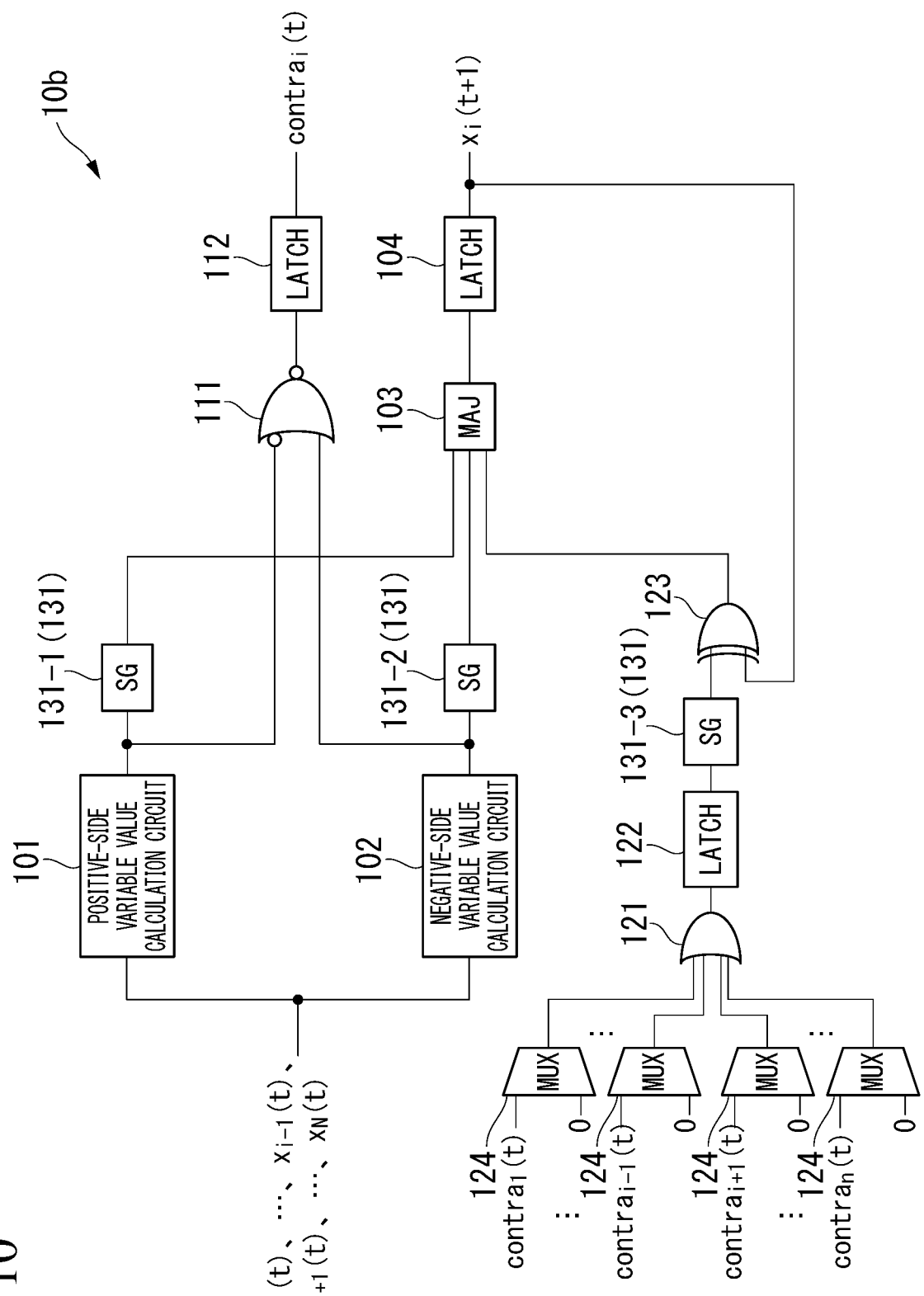
FIG. 10 is a diagram illustrating an example of a configuration of the variable value calculation circuit in a case where the number of literals included in a clause is not limited to three in the embodiment.

FIG. 10 is a diagram illustrating the example of the configuration of the variable value calculation circuit in the case where the number of literals included in the clause is not limited to three. The variable value calculation circuit 10b illustrated in FIG. 10 includes a positive-side variable value calculation circuit 101, a negative-side variable value calculation circuit 102, the majority decision circuit 103, the variable value latch 104, the error circuit 131, the contradiction detection circuit 111, the contradiction detection-side latch 112, the contradiction detection merging circuit 121, the reflection-side latch 122, the contradiction detection reflection circuit 123, and the multiplexer 124.

Among the respective units of FIG. 10, the same reference symbols (103, 104, 111, 112, 121, 122, 123, 124, 131-1, 131-2, and 131-3) are attached to parts having the same functions corresponding to the respective units of FIG. 5, and, here, the description will not be repeated.

In FIGS. 10 to 14, an example of a configuration of an inside of the variable value calculation circuit 10b will be described while a variable calculated by the variable value calculation circuit 10b is set to $x_i$ ($1 \le i \le N$). Variables whose values are calculated by another variable value calculation circuit 10 at time (clock timing) t are expressed as $x_1(t), \ldots, x_{i-1}(t), x_{i+1}(t), \ldots, x_N(t)$. Another variable value calculation circuit 10 may be the variable value calculation circuit 10a or 10b. Otherwise, another variable value calculation circuit 10 may be the variable value calculation circuit 10c which will be described later.

The positive-side variable value calculation circuit 101 calculates the value of the variable $x_i$ based on the clause including the variable $x_i$ having no negation.

The negative-side variable value calculation circuit 102 calculates the value of the variable $x_i$ based on the clause including the variable $x_i$ ($\neg xi$) having negation.

Figure 11:
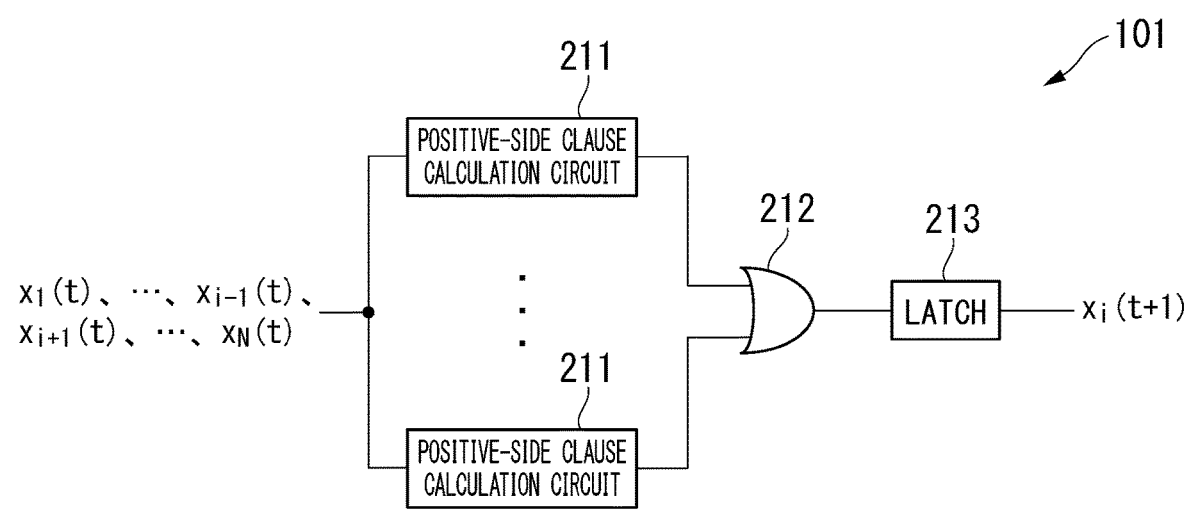
FIG. 11 is a diagram illustrating an example of a configuration of a positive-side variable value calculation circuit according to the embodiment.

FIG. 11 is a diagram illustrating an example of a configuration of the positive-side variable value calculation circuit 101. In the example of FIG. 11, the positive-side variable value calculation circuit 101 includes the positive-side clause calculation circuit 211, the positive-side product circuit 212, and the positive-side latch 213. The positive-side product circuit 212 and the positive-side latch 213 are the same as in the case of FIG. 5, and, here, description will not be repeated. The positive-side clause calculation circuit 211 calculates the value of the variable $x_i$ based on one clause including the variable $x_i$ having no negation.

Figure 12:
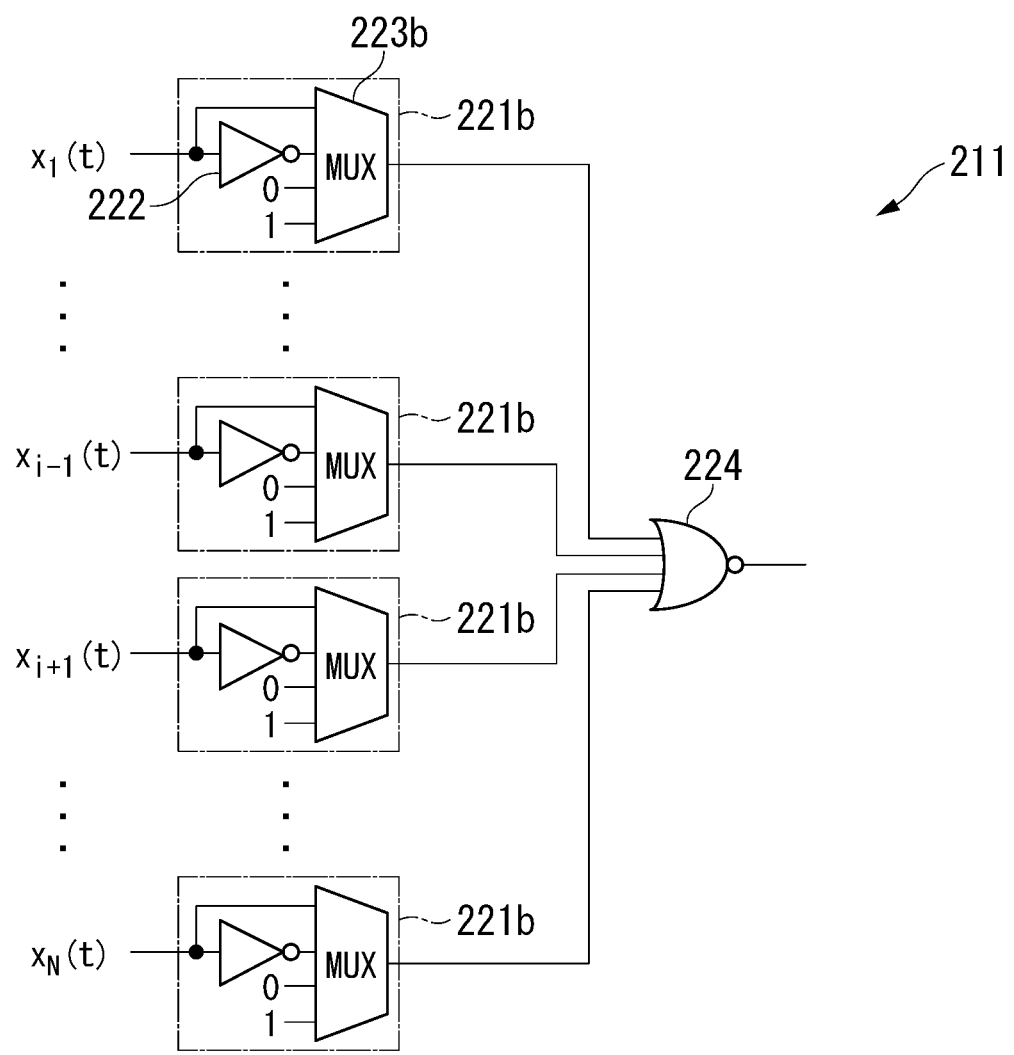
FIG. 12 is a diagram illustrating an example of a configuration of a positive-side clause calculation circuit according to the embodiment.

FIG. 12 is a diagram illustrating an example of a configuration of the positive-side clause calculation circuit 211. In the example of FIG. 12, the positive-side clause calculation circuit 211 includes the literal circuit 221b and the positive-side sum circuit 224. The literal circuit 221b includes the NOT circuit 222 and a multiplexer 223b.

The positive-side sum circuit 224 is the same as in a case of FIG. 5 other than a fact that the number of inputs is not limited to two.

In the literal circuit 221b, an input of false (logic 0) to the multiplexer 223b is provided, in addition to the configuration of the literal circuit 221 of FIG. 5. In a case where the number of variables included in the clause is smaller than N, multiplexers of remaining literal circuits 221b of N literal circuits 221b select false, and thus it is possible to cause the remaining literal circuits 221b to be non-use.

Figure 13:
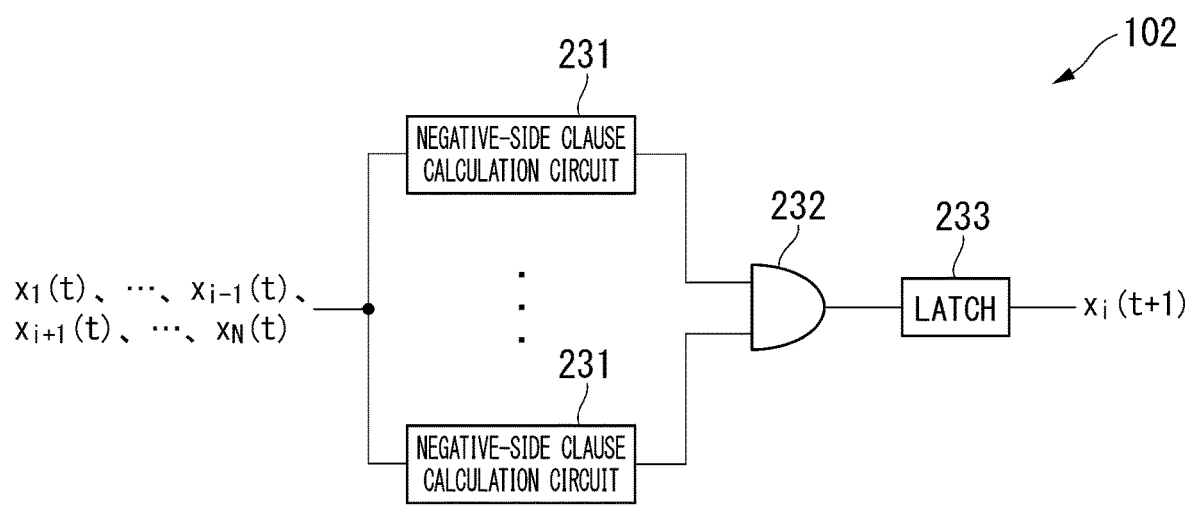
FIG. 13 is a diagram illustrating an example of a configuration of a negative-side variable value calculation circuit according to the embodiment.

FIG. 13 is a diagram illustrating an example of a configuration of the negative-side variable value calculation circuit 102. In the example of FIG. 13, the negative-side variable value calculation circuit 102 includes a negative-side clause calculation circuit 231, a negative-side product circuit 232, and a negative-side latch 233.

The negative-side product circuit 232 and the negative-side latch 233 are the same as in the case of FIG. 5, and thus, here, the description thereof will not be repeated.

The negative-side clause calculation circuit 231 calculates the value of the variable $x_i$ based on one clause including the variable $x_i$ ($\neg x_i$) having negation.

Figure 14:
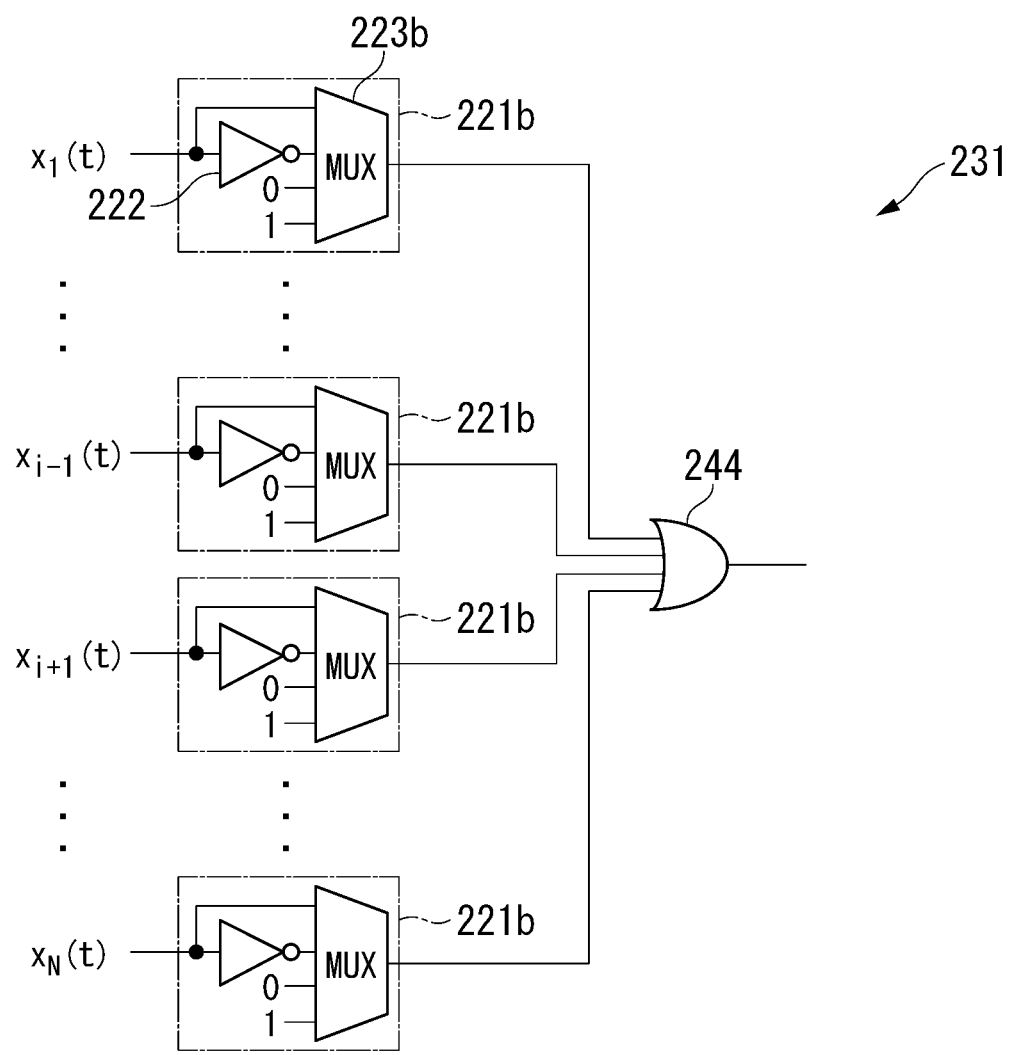
FIG. 14 is a diagram illustrating an example of a configuration of a negative-side clause calculation circuit according to the embodiment.

FIG. 14 is a diagram illustrating an example of a configuration of the negative-side clause calculation circuit 231. In the example of FIG. 14, the negative-side clause calculation circuit 231 includes the literal circuit 221b and the negative-side sum circuit 244. The literal circuit 221b includes the NOT circuit 222 and a multiplexer 223b.

The negative-side sum circuit 244 is the same as in the case of FIG. 5 other than a fact that the number of inputs is not limited two.

The literal circuit 221b is the same as in a case of FIG. 12, and thus, here, the description thereof will not be repeated.

As described above, the variable value calculation circuit 10 is provided for each variable included in the conjunctive-normal-form logical expression, and calculates the value of the target variable. The notification path 20 notifies another variable value calculation circuit 10 of the value of the target variable calculated by the variable value calculation circuit 10. The positive-side variable value calculation circuit 101 of the variable value calculation circuit 10b, which is the example of the variable value calculation circuit 10, calculates the value of the variable $x_i$ for which, among the clauses of the logical expression, all the clauses including the variable $x_i$ having no negation are true in a case where the value of another variable calculated by another variable value calculation circuit is input to the logical expression with regard to the value of the variable $x_i$ (target variable). In a case where the value of another variable calculated by another variable value calculation circuit 10 is input to the logical expression, the negative-side variable value calculation circuit 102 calculates the value of the variable $x_i$ for which, among the clauses of the conjunctive-normal-form logical expression, all the clauses including the variable $x_i$ ($\neg x_i$) having negation are true. The majority decision circuit 103 calculates the value of the variable $x_i$ based on the value of the variable $x_i$ calculated by the positive-side variable value calculation circuit 101, the value of variable $x_i$ calculated by the negative-side variable value calculation circuit 102, and the previous value of the variable xi.

In this manner, in the solution search device 1, for each variable, the value of the variable is calculated based on each of the clause including the variable having no negation and the clause including the variable having negation, and the value of the variable (current value) is determined based on the calculated value of the variable and the previous value. Therefore, it is possible to handle SAT instances. Specifically, it is possible for the solution search device 1 to increase the number of variables to be treated and the number of clauses without restriction in a case where physical limitations are ignored.

In this manner, according to the solution search device 1, it is possible to search for a solution to arbitrary SAT instances.

In addition, the positive-side variable value calculation circuit 101 includes the positive-side clause calculation circuit 211 that outputs true in a case where, among the literals included in the clause including the variable $x_i$ having no negation among the clauses of the logical expression, all the literals other than the literal of the variable $x_i$ are false, and that outputs false in a case where, among the literals other than the literal of the variable $x_i$, any one or more literals are true, and the positive-side product circuit 212 that calculates the logical OR of the outputs, which corresponds to all the clauses including the variable $x_i$ having no negation among the clauses of the logical expression, of the positive-side clause calculation circuit 211.

Therefore, the positive-side variable value calculation circuit 101 has high versatility with respect to a problem. Specifically, in the positive-side variable value calculation circuit 101, it is possible to increase the number of variables to be treated and the number of clauses without restriction in a case where the physical limitations are ignored.

In addition, the positive-side clause calculation circuit 211 includes the literal circuit 221 (multiplexer 223) that selects any one of a value of another variable calculated by another variable value calculation circuit 10, negation of the value of another variable, and true according to an aspect of the literal of another variable in the clause, and the positive-side sum circuit 224 that calculates the logical NOR of the outputs, which correspond to all the literals included in the clause, of all the literal circuits 221.

Therefore, the positive-side clause calculation circuit 211 a high versatility to handle problem instances. Specifically, in the positive-side clause calculation circuit 211, it is possible to correspond to the various literals through setting of the selection by the literal circuit 221, and thus it is not necessary to rearrange the circuit.

In addition, it is possible to mount the positive-side clause calculation circuit 211 with a simple hardware configuration using the multiplexer and the logical NOR circuit.

In addition, the negative-side variable value calculation circuit 102 includes the negative-side clause calculation circuit 231 that outputs false in a case where, among the literals included in the clause including the variable $x_i$ ($\neg x_i$) having negation in the clauses of the logical expression, all the literals other than the literal of the variable $x_i$ are false, and outputs true in a case where any one or more literals other than the literal of the variable $x_i$ are true, and the negative-side product circuit 232 that calculates the logical AND of the outputs, which correspond to all the clauses including the variable having negation among the clauses of the logical expression, of the negative-side clause calculation circuit 231.

Therefore, the negative-side variable value calculation circuit 102 has a high versatility to handle problem instances. Specifically, in the positive-side variable value calculation circuit 101, it is possible to increase the number of variables to be treated and the number of clauses without restriction in a case where the physical limitations are ignored.

In addition, the negative-side clause calculation circuit 231 includes the literal circuit 221 (multiplexer 223), and the negative-side sum circuit 244 that calculates the logical OR of the outputs, which correspond to all the literals included in the clause, of all the literal circuits 221.

Therefore, the negative-side clause calculation circuit 231 has a high versatility to handle problem instances. Specifically, in the negative-side clause calculation circuit 231, it is possible to correspond to the various literals through setting of the selection by the literal circuit 221, and thus it is not necessary to rearrange the circuit.

In addition, it is possible to mount the negative-side clause calculation circuit 231 with a simple hardware configuration using the multiplexer and the logical OR circuit.

In addition, the error circuit 131 performs true-false reversal on at least any of the value of the variable $x_i$ calculated by the positive-side variable value calculation circuit 101 and the value of the variable $x_i$ calculated by the negative-side variable value calculation circuit 102 by with a predetermined probability.

Therefore, it is possible to increase a speed of the solution search performed by the solution search device 1, and thus it is expected that time required to detect the solution is reduced.

In addition, in a case where the solution search device 1 stops at an incorrect solution state or is fallen into a looping state, it is possible to escape from the incorrect solution state in such a way that the error circuit 131 reverses the value of the variable as above.

In addition, in a case of a problem instance having multiple solutions, it is possible to withdraw from a stable state in which the solution is detected and to search for another solution in such a way that the error circuit 131 reverses the value of the variable as above in a state in which the solution search device 1 detects one solution.

In addition, the contradiction detection circuit 111 detects that the value of the variable calculated by the positive-side variable value calculation circuit 101 and the value of the variable calculated by the negative-side variable value calculation circuit 102 are incompatible. The contradiction detection reflection circuit 123 reflects the detection result of the contradiction detection circuit 111 in another variable value calculation circuit 10 on the calculation, which is performed by the majority decision circuit 103, of the value of the variable.

Therefore, in the solution search device 1, it is possible to increase the speed of the solution search by promoting the change in the value of the variable in case where the contradiction occurs in the value of the variable calculated in the solution search, and thus it is expected that time required to detect the solution is reduced.

In addition, in a case where the contradiction detection circuit 111 in another variable value calculation circuit 10 detects that the value of the variable $x_i$ calculated by the positive-side variable value calculation circuit 101 and the value of the variable xi calculated by the negative-side variable value calculation circuit 102 are incompatible, the error circuit 131-3 suppresses reflection of the detection result on the calculation, which is performed by the majority decision circuit 103, of the value of the variable, with a predetermined probability.

Therefore, it is possible for the solution search device 1 to adjust a frequency at which a contradiction detection result of the value of the variable calculated in the solution search is reflected on the value of the variable, and thus it is expected that time required to detect the solution is reduced.

Here, in a case where the contradiction detection reflection circuit 123 reflects the detection result of the contradiction detection circuit 111 in another variable value calculation circuit 10 on the calculation of the value of the variable, it is possible to promote to solve a state in which the contradiction occurs in the value of the variable as a candidate of the solution. In contrast, in the reflection of the contradiction detection result, the value of the variable as the candidate of the solution calculated by the solution search device 1 is changed. Therefore, in a case where the reflection of the contradiction detection result is frequently performed, there is a high possibility of being away from the solution. In contrast, in a case where the contradiction detection circuit 111 in another variable value calculation circuit 10 detects the contradiction, the error circuit 131-3 suppresses reflection of the detection result on the value of the variable, and thus it is expected that it is possible to suppress from being away from the solution. In this manner, according to the error circuit 131-3, promotion of the solution of the state in which the contradiction occurs in the value of the variable as the candidate of the solution and to and suppression from being away from the solution are compatible, and thus it is expected that time required to detect the solution is reduced.

The number and the locations of the error circuits 131 of FIG. 10 are examples. The number and the locations of the error circuits 131 included in the variable value calculation circuit 10b are not limited to the examples, and various numbers and locations are possible.

For example, there is a case where the solution search is performed even in a configuration in which the variable value calculation circuit 10b does not include some or the whole of the error circuits 131 illustrated in FIG. 10 as in a configuration in which the variable value calculation circuit 10b does not include the positive-side error circuit 131-1 and the negative-side error circuit 131-2.

In addition, the error circuits 131 may be provided at the back of the variable value latch 104. In this case, all the three error circuits 131 illustrated in FIG. 10 may remain or a configuration in which some or the whole of the error circuits 131 are removed may be used.

FIGS. 10, 11, and 13 illustrate four latches including the variable value latch 104, the contradiction detection-side latch 112, the reflection-side latch 122, the positive-side latch 213, and the negative-side latch 233. The number and the locations of the latches are examples, and the number and the locations of the latches included in the variable value calculation circuit 10b are not limited to the examples, and various numbers and locations are possible.

For example, according to a magnitude of delay in each logic gate and each multiplexer, there is a case where it is possible to calculate the value of the variable at appropriate timing even in a configuration in which the variable value calculation circuit 10b does not include some or the whole of the five latches illustrated in FIGS. 10, 11, and 13.

In addition, the latches may be provided in a configuration illustrated in FIG. 12 or the latches may be provided in a configuration illustrated in FIG. 14.

In addition, a method of configuring the latches included in the variable value calculation circuit 10b is not limited to a specific configuration method, and it is possible to configure the latches using various circuits which are capable of holding input values. For example, some or the whole of the latches included in the variable value calculation circuit 10b may be configured using a flip-flop.

A configuration in which the variable value calculation circuit 10 does not include the multiplexer may be provided. The point will be described with reference to FIG. 15.

Figure 15:
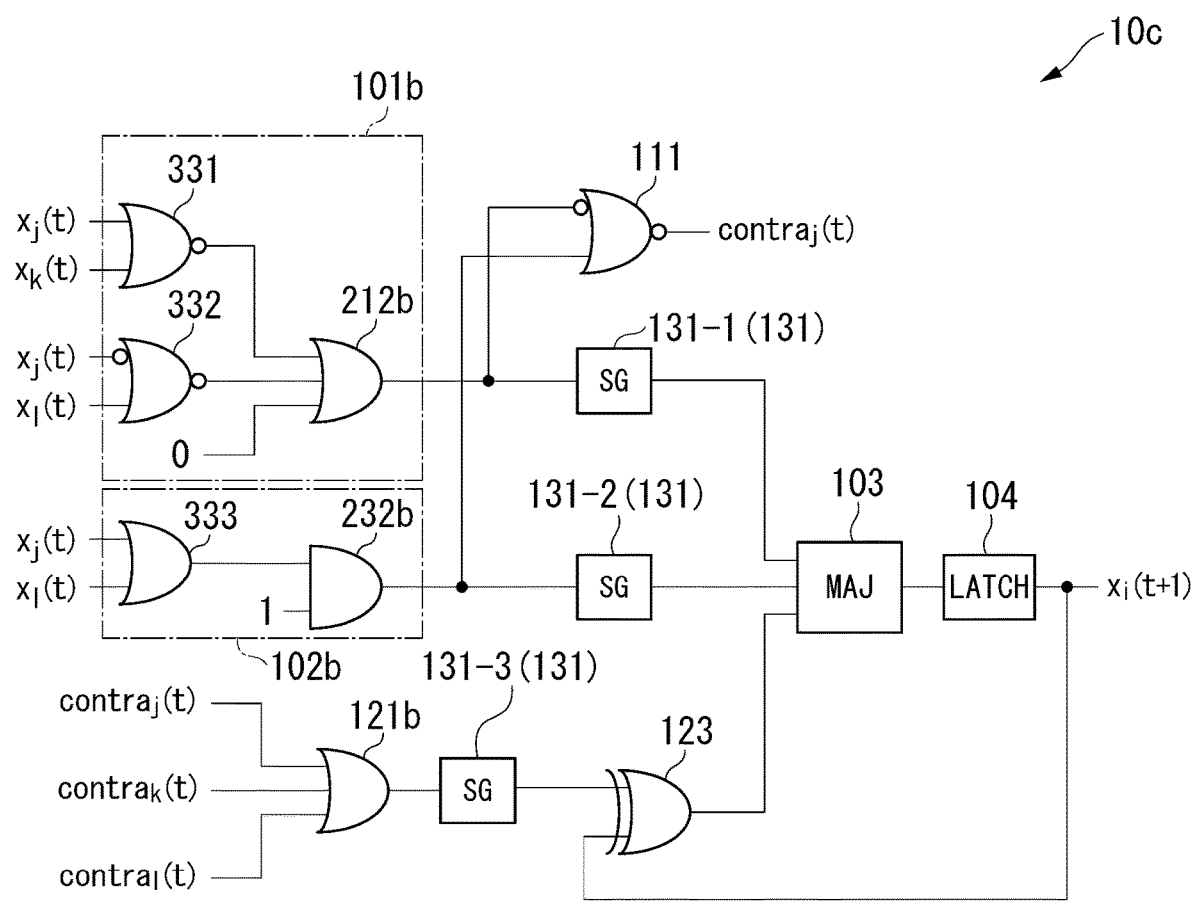
FIG. 15 is a diagram illustrating an example of a configuration of the variable value calculation circuit, which does not include the multiplexer, in relation to the embodiment.

FIG. 15 is a diagram illustrating an example of a configuration in which the variable value calculation circuit does not include the multiplexer. The variable value calculation circuit 10c illustrated in FIG. 15 includes a positive-side variable value calculation circuit 101b, a negative-side variable value calculation circuit 102b, the majority decision circuit 103, the variable value latch 104, the error circuits 131, the contradiction detection circuit 111, the contradiction detection merging circuit 121b, and the contradiction detection reflection circuit 123. The positive-side variable value calculation circuit 101b includes the positive-side product circuit 212 and logic gates 331 and 332. The negative-side variable value calculation circuit 102a includes a negative-side product circuit 232b and a logic gate 333.

In respective units of FIG. 15, the same reference symbols (103, 104, 111, 123, 131-1, 131-2, and 131-3) are attached to parts having the same functions corresponding to the respective units of FIG. 5, and, here, the description will not be repeated.

In FIG. 15, an example of a configuration of an inside of the variable value calculation circuit 10c will be described while a variable whose value is calculated by the variable value calculation circuit 10c is set to $x_i$. A variable whose value is calculated by another variable value calculation circuit 10 at time (clock timing) t is expressed as $x_j(t)$, $x_k(t)$, or $x_l(t)$. Another variable value calculation circuit 10 may be the variable value calculation circuit 10a, 10b, or 10c.

The variable value calculation circuit 10c corresponds to the example of the variable value calculation circuit 10, and calculates the value of the variable $x_i$. FIG. 15 illustrates an example in a case where the variable value calculation circuit 10c acquires the value of the variable $x_i$ for which "$(x_i+x_j+x_k)(x_i+\neg x_j+x_l)(\neg x_i+x_j+x_l)(\neg x_k+x_l+x_m)=1$" is established.

The positive-side variable value calculation circuit 101b corresponds to an example of the positive-side variable value calculation circuit 101, and calculates the value of the variable $x_i$ based on the clause including the variable $x_i$ having no negation. In above Equation "$(x_i+x_j+x_k)(x_i+\neg x_j+x_l)(\neg x_i+x_j+x_l)(\neg x_k+x_l+x_m)=1$", clauses "$(x_i+x_j+x_k)$" and "$(x_i+\neg x_j+x_l)$" correspond to the clause including the variable $x_i$ having no negation.

Each of the logic gates 331 and 332 corresponds to an example of the positive-side clause calculation circuit 211, and calculates the value of the variable xi based on one clause including the variable $x_i$ having no negation.

The logic gate 331 calculates the value of the variable $x_i$ for which a value of the clause "$(x_i+x_j+x_k)$" becomes "1". In a case where a value of at least any one value of the literals $x_j$ and $x_k$ is "1", the value of the clause "$(x_i+x_j+x_k)$" becomes "1" regardless that the value of the variable $x_i$ is "0" or "1". In this case, the logic gate 331 calculates the value of the variable $x_i$ as "0".

In contrast, in a case where both the values of the literals $x_j$ and $x_k$ are "0", it is necessary that the value of the variable $x_i$ is "1" such that the value of the clause "$(xi+x_j+x_k)$" becomes "1". In this case, the logic gate 331 calculates the value of the variable $x_i$ as "1".

The logic gate 332 calculates the value of the variable $x_i$ for which a value of the clause "$((x_i+\neg x_j+x_l)$" becomes "1". In a case where at least any one of the values of the literals $\neg x_j$ and $x_l$ is "1", the value of the clause "$(x_i+\neg x_j+x_l)$" becomes "1" regardless that the value of the variable $x_i$ is any of "0" and "1". In this case, the logic gate 332 calculates the value of the variable $x_i$ as "0".

In contrast, in a case where both the values of the literals $\neg x_j$ and $x_l$ are "0", it is necessary that the value of the variable $x_i$ is "1" such that the value of the clause "$(x_i+\neg x_j+x_l)$" becomes "1". In this case, the logic gate 332 calculates the value of the variable $x_i$ as "1".

In an example of the logic gate 331, both the literals $x_j$ and $x_k$, which are input to the logic gate 331, do not have negation ($\neg$). In this case, similar to the logic gate 331, the positive-side clause calculation circuit 211 is configured using the NOR circuit.

In contrast, in an example of the logic gate 332, the literal $\neg x_j$ has negation ($\neg$) in the literals $\neg x_j$ and $x_l$ to be input to the logic gate 332. Here, the logic gate 332 has negation of the value of the variable $x_j(t)$. That is, the logic gate 332 reverses true (1) and false (0) of the value of the variable $x_j(t)$ to be input.

In this manner, as the logic gate which configures the positive-side clause calculation circuit 211, it is possible to use the value of the variable to be input as it is for the literal having no negation and to use a logic gate which has negation of the value of the variable to be input for the literal having negation.

The positive-side product calculation circuit 212b corresponds to an example of the positive-side product calculation circuit 212, and performs a logical AND operation of coupling each clause including $x_i$ having no negation. Specifically, the positive-side product circuit 212b acquires OR of outputs of the logic gates 331 and 332 which are examples of the positive-side clause calculation circuit 211.

In the example of FIG. 15, the positive-side product calculation circuit 212b receives inputs, the number of which is larger than the number of clauses including $x_i$ having no negation. While the number of clauses including $x_i$ having no negation is two, the positive-side product calculation circuit 212b receives three inputs. "0" indicative of false is input for inputs, the number of which is larger than the number of clauses including $x_i$ having no negation, among the inputs to the positive-side product calculation circuit 212b. The input "0" does not affect an OR operation performed by the positive-side product calculation circuit 212b.

In this manner, it is possible to configure the positive-side product calculation circuit 212 using an OR circuit which receives inputs, the number of which is the same as the number of clauses including $x_i$ having no negation, or inputs, the number of which is larger than the number of clauses including $x_i$ having no negation. It is possible to input "0" for the inputs, the number of which is larger than the number of clauses including $x_i$ having no negation, among inputs to the OR circuit.

The negative-side variable value calculation circuit 102b corresponds to an example of the negative-side variable value calculation circuit 102, and calculates the value of the variable $x_i$ based on the clause including the variable $x_i$ ($\neg x_i$) having negation. In above Equation "$(x_i+x_j+x_k)(x_i+\neg x_j+x_l)(\neg x_i+x_j+x_l)(\neg x_k+x_l+x_m)=1$", the clause "$(\neg x_i+x_j+x_l)$" corresponds to the clause including the variable $x_i$ having negation.

The logic gate 333 corresponds to an example of the negative-side clause calculation circuit 231, and calculates the value of the variable $x_i$ based on the clause including the variable $x_i$ having negation. The logic gate 333 calculates the value of the variable $x_i$ for which the value of the clause "$(\neg x_i+x_j+x_l)$" becomes "1". In a case where at least any one of values of the literals $x_j$ and $x_k$ is "1", the value of the clause "$(\neg x_i+x_j+x_l)$" becomes "1" regardless that the value of the variable $x_i$ is "0" or "1". In this case, the logic gate 333 calculates the value of the variable $x_i$ as "1".

In contrast, in a case where both the values of the literals $x_j$ and $x_k$ are "0", it is necessary that the value of the variable $x_i$ is "0" such that the value of the clause "$(\neg x_i+x_j+x_l)$" becomes "1". In this case, the logic gate 333 calculates the value of the variable $x_i$ as "0".

Similar to the description for the positive-side clause calculation circuit 211 using the logic gates 331 and 332 as examples, as the logic gate which configures the negative-side clause calculation circuits 231, it is possible to use the value of the variable to be input as it is for the literal having no negation and to use a logic gate, which have negation of the value of the variable to be input for the literal having negation.

The negative-side product calculation circuit 232b corresponds to an example of the negative-side product calculation circuit 232, and performs the logical AND operation of coupling each clause including the $x_i$ having negation. Specifically, the negative-side product circuit 232b acquires AND of the output from the negative-side clause calculation circuits 231. In the example of FIG. 15, the logic gate corresponding to the example of the negative-side clause calculation circuit 231 is only the logic gate 333. Here, the negative-side product circuit 232b outputs the output of the logic gate 333 as it is.

In the example of FIG. 15, the negative-side product calculation circuit 232b receives inputs, the number of which is larger than the number of clauses including $x_i$ having negation. While the number of clauses including $x_i$ having negation is one, the negative-side product calculation circuit 232b receives two inputs. Among inputs to the negative-side product calculation circuit 232b, "1" indicative of true is input for the inputs, the number of which is larger than the number of clauses including $x_i$ having negation. The input "1" does not affect the AND operation performed by the negative-side product calculation circuit 232b.

In this manner, it is possible to configure the negative-side product calculation circuit 232 using an AND circuit which receives inputs, the number of which is the same as the number of clauses including $x_i$ having negation, or inputs, the number of which is larger than the number of clauses including $x_i$ having negation. Among the inputs to the AND circuit, it is possible to input "1" for the inputs, the number of which is larger than the number of clauses including $x_i$ having negation.

The contradiction detection merging circuit 121b corresponds to an example of the contradiction detection merging circuit 121, and colligates the contradiction detection result notified by another variable value calculation circuit 10. Specifically, the contradiction detection merging circuit 121b acquires OR of the signal of the contradiction detection result notified from another variable value calculation circuit 10. In a case where any of the variable value calculation circuits 10 detects contradiction, the contradiction detection merging circuit 121b outputs 1. In a case where any of the variable value calculation circuits 10 does not detect the contradiction, the contradiction detection merging circuit 121b outputs 0.

The contradiction detection merging circuit 121b receives an input of the contradiction detection result in which a variable that shares the clause with the variable $x_i$ becomes a target. In the example of FIG. 15, the variable that shares the clause with the variable $x_i$ includes the variables $x_j$, $x_k$, and $x_l$. The contradiction detection merging circuit 121b receives inputs of the contradiction detection results $contra_j(t)$, $contra_k(t)$, and $contra_l(t)$ in which the variables $x_j$, $x_k$, and $x_l$ become the target.

In both the example of FIG. 5 and the example of FIG. 10, the multiplexer 124 selects the contradiction detection result in which the variable that shares the clause with the variable $x_i$ becomes the target, and the selected contradiction detection results are input to the contradiction detection merging circuit 121.

In contrast, in the example of FIG. 15, the contradiction detection result, in which the variable that shares the clause with the variable $x_i$ becomes the target, is directly input to the contradiction detection merging circuit 121b. Therefore, in the configuration of the FIG. 15, it is possible to cause the multiplexer 124 to be unnecessary.

Among inputs to the contradiction detection merging circuit 121, "0" indicative of false is input for inputs, the number of which is larger than the number of variables that share the clause with the variable xi. The input "0" does not affect the OR operation performed by the contradiction detection merging circuit 121.

Subsequently, an example of the solution search performed by solution search device 1 will be described with reference to FIGS. 16 to 18.

Figure 16:
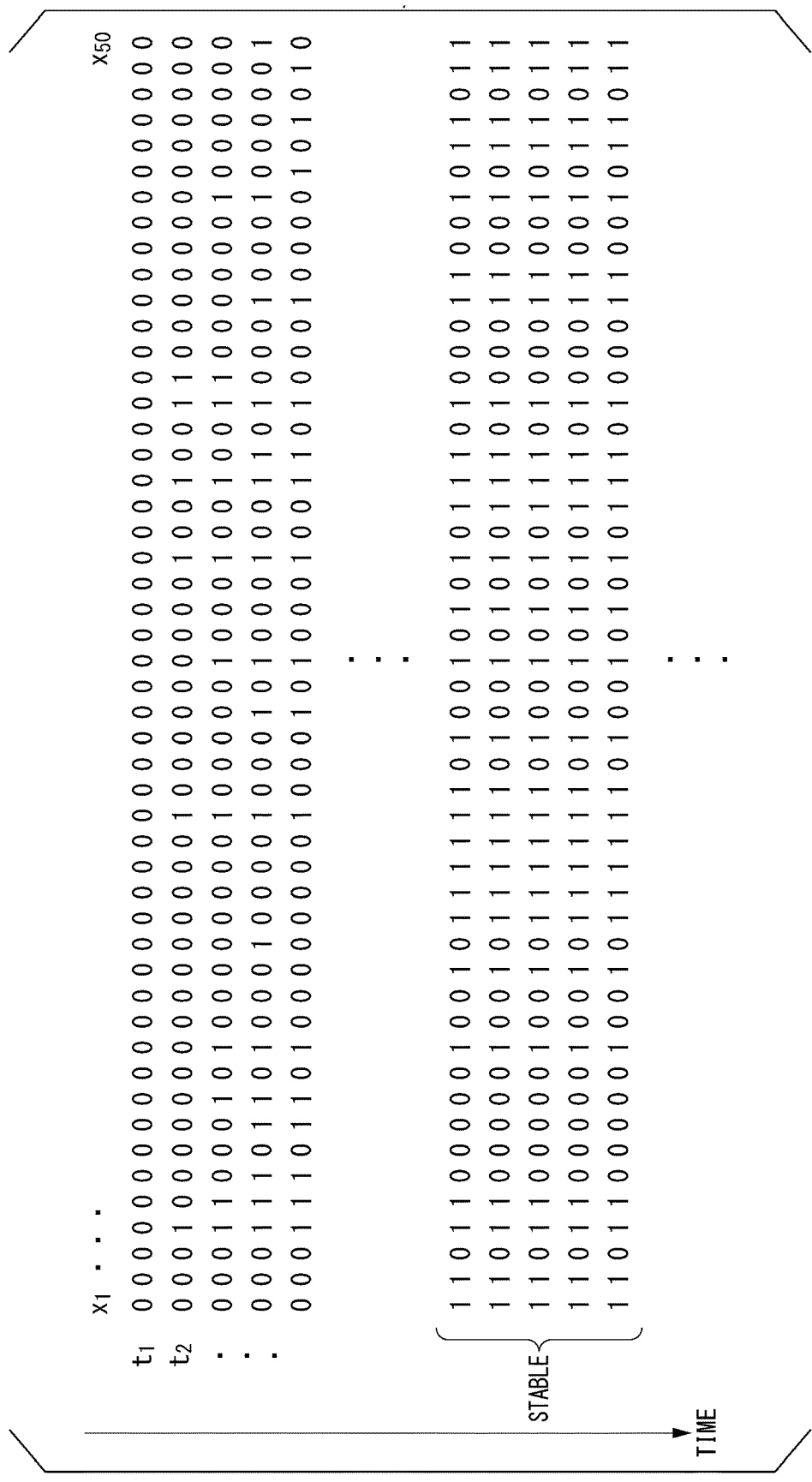
FIG. 16 is a diagram illustrating a first example of a solution search using the solution search device according to the embodiment.

FIG. 16 is a diagram illustrating a first example of the solution search using the solution search device 1.

FIG. 16 illustrates an example of a case where a SAT instance uf50-0100.cnf, in which one solution exists, is solved. In a logical expression of the SAT instance uf50-0100.cnf, the number of variables is 50 and the number of clauses is 218.

In the example of FIG. 16, a state (value of the variable) is stable in a case where the value of the variable is equivalent to the solution. In this manner, in the solution search device 1, it is possible to detect a fact that the solution is found because the state is stable.

Figure 17:
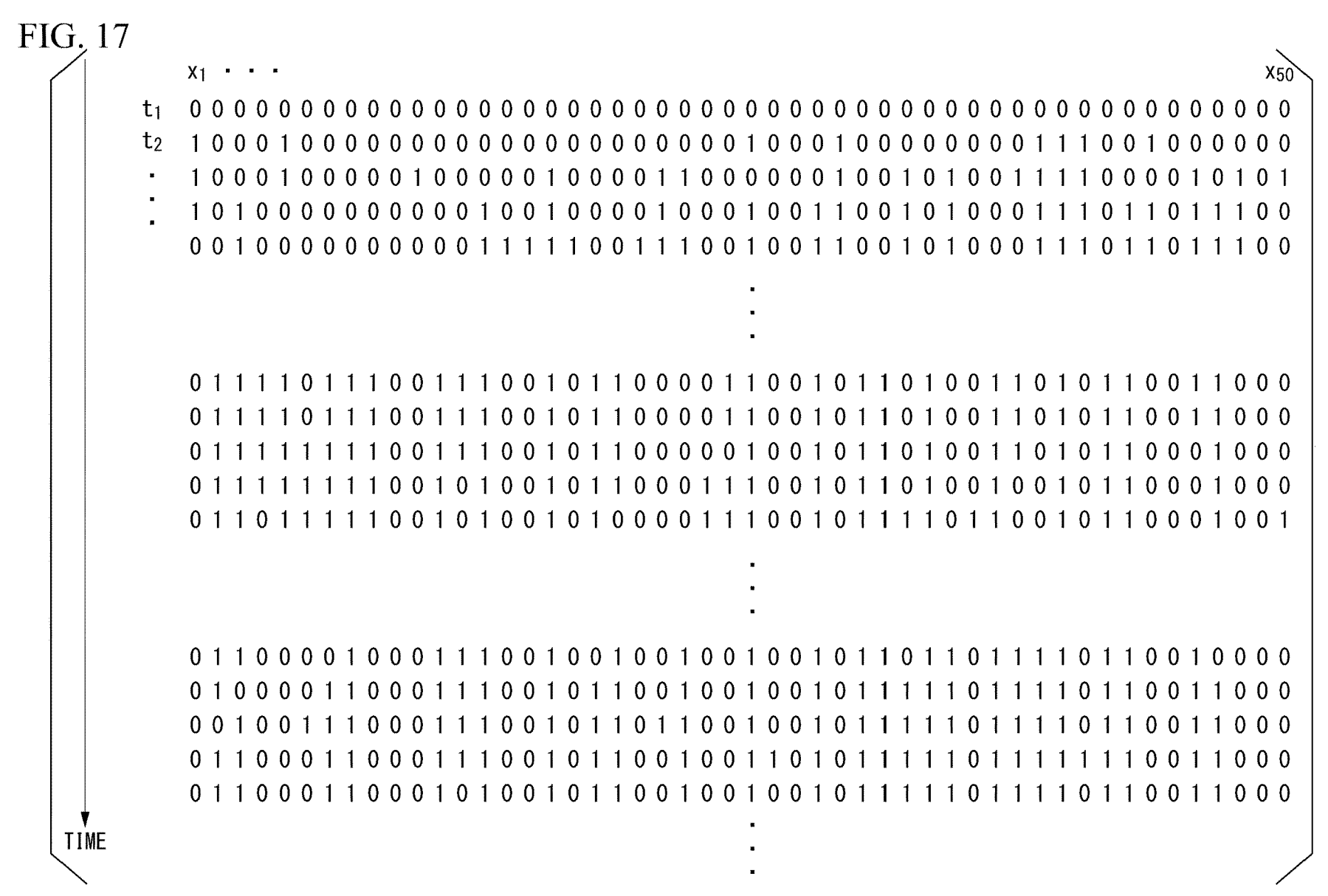

FIG. 17 is a diagram illustrating a second example of the solution search using the solution search device 1.

FIG. 17 illustrates an example of a case where a SAT instance uuf50-01.cnf, in which the solution does not exist, is solved. In a logical expression of the SAT instance uuf50-01.cnf, the number of variables is 50 and the number of clauses is 218.

In the example of FIG. 17, it is not possible to find a solution, and the state is not stable.

In this manner, according to the present invention, it is possible to estimate that the solution does not exist.

Figure 18:
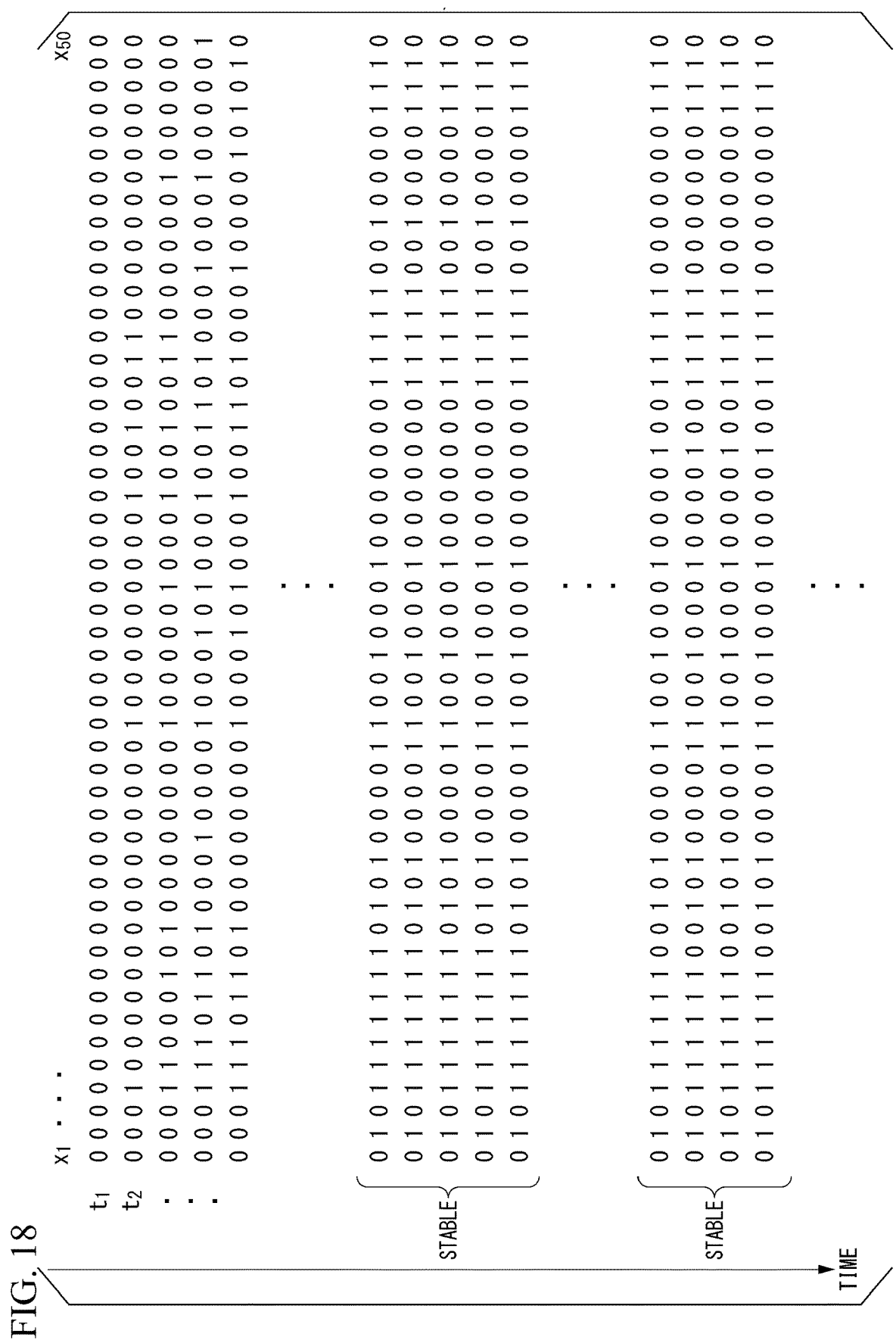
FIG. 18 is a diagram illustrating a third example of the solution search using the solution search device according to the embodiment.

FIG. 18 is a diagram illustrating a third example of the solution search using the solution search device 1.

FIG. 18 illustrates an example of a case where a SAT instance uf50-01.cnf, in which two or more solutions exist, is solved. In a logical expression of the SAT instance uf50-01.cnf, the number of variables is 50 and the number of clauses is 218. In the example of FIG. 18, a state is stable in a case where the value of the variable becomes equivalent to the solutions. In a case where the value of the variable is equivalent to another solution after the value of the variable is changed from the state, the state is stable again.

In this manner, in the solution search device 1, it is possible to find multiple solutions because the state is stable with each of the multiple solutions.

Subsequently, an advantage acquired by the solution search device 1 will be described using a relationship with an amoeba-inspired algorithm with reference to FIG. 19.

The amoeba-inspired algorithm is proposed as an algorithm for searching for a solution to SAT or the like. In the amoeba-inspired algorithm, dynamics of an amoeba is simulated by reflecting a property that the amoeba avoids light and an operation, which is opposed to the property of avoiding light with a small probability, in association with pseudopod-like branches of the amoeba which expands and contracts the variable.

Figure 19:
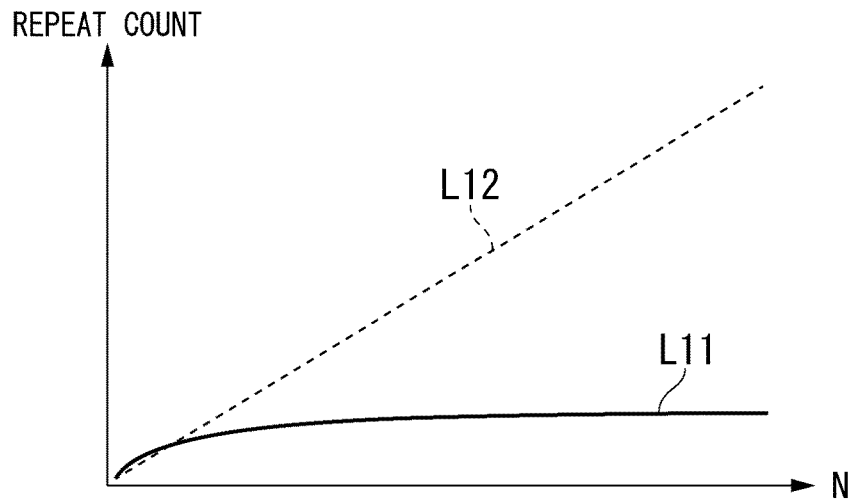
FIG. 19 is a graph illustrating an example of a repeat count of the solution search in a case where SAT is solved using an amoeba-inspired algorithm.

FIG. 19 is a graph illustrating an example of a repeat count of the solution search in a case where the SAT instance is solved using the amoeba-inspired algorithm.

Here, for easy quantitative estimation of performance of the amoeba-inspired algorithm in a case where a problem size (the number of variables N) of the SAT instance is increased, the SAT instance, which has only one satisfiable solution even though the number of variables increases, is prepared using the following method.

An instance of SAT, uf50-0100.cnf, which is previously known to have a unique solution, has 50 variables and 218 clauses.

k copies of uf50-0100.cnf are coupled by the logical AND such that variables are not shared with each other.

In this manner, it is possible to prepare a SAT instance, which has k×50 variables, k×218 clauses, and a unique solution.

Here, the repeat count of the solution search is the number of times of calculating a set of the values of the variables as candidates of the solution. In the graph of FIG. 19, a horizontal axis indicates a size of the problem (the number of variables N), and a vertical axis indicates the repeat count.

A line L11 indicates a relationship between the size of the problem and a repetition coefficient in the solution search according to the amoeba-inspired algorithm. A line L12 indicates a relationship between the size of the problem and the repeat count in a conventional stochastic local search algorithm for solving SAT. In the conventional stochastic local search algorithm, the repeat count becomes O(N) (order of N) in this case. In contrast, in the amoeba-inspired algorithm, the repeat count becomes O (log N) (order of log N) in this case.

In a case of the solution search device 1, it is possible to acquire the solution by a relatively small repeat count, similar to the case of the amoeba-inspired algorithm Further, according to the solution search device 1, time required for one repetition process is relatively short. Therefore, according to the solution search device 1, it is possible to search for the solution in relatively short time.

The whole or a part of the solution search device 1 may be emulated (simulated) by a computer.

Figure 20:
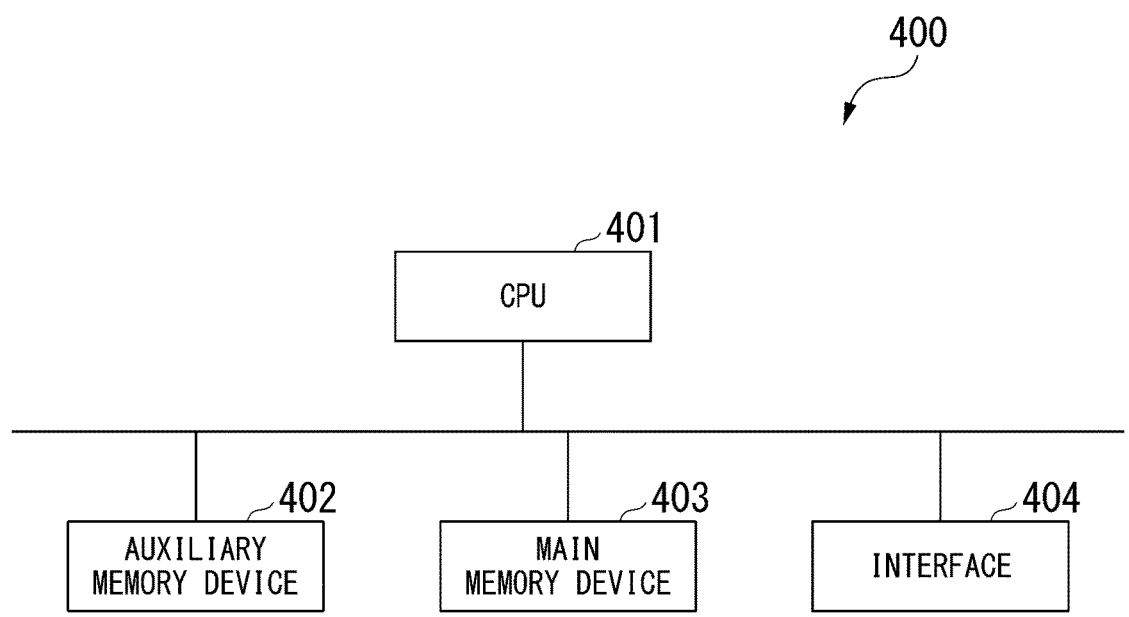
FIG. 20 is a schematic block diagram illustrating a configuration of a computer according to at least one embodiment.

FIG. 20 is a schematic block diagram illustrating an example of a configuration of a computer according to at least one embodiment. In the configuration of FIG. 20, a computer 400 includes a Central Processing Unit (CPU) 401, a main memory device 402, an auxiliary memory device 403, and an interface 404.

In a case where the whole of the above-described solution search device 1 is emulated by one computer 400, operations of the respective units of the solution search device 1 are stored in the auxiliary memory device in a program form. The CPU 401 reads the program from the auxiliary memory device 402 and deploys the program in the main memory device 403, and simulates an operation of the solution search device 1 according to the program. In addition, the CPU 401 secures a storage area corresponding to an element configured using a memory, such as the latch, in the main memory device 403 according to the program.

In a case where one variable value calculation circuit 10 is emulated by one computer 400, operations of the respective units of the variable value calculation circuit 10 are stored in the auxiliary memory device in the program form. The CPU 401 reads the program from the auxiliary memory device 402 and deploys the program in the main memory device 403, and simulates an operation of the variable value calculation circuit 10 according to the program. In addition, the CPU 401 secures a storage area corresponding to an element configured using a memory, such as the latch, in the main memory device 403 according to the program. In addition, the CPU 401 exchanges a signal with another variable value calculation circuit 10 through the interface 404.

The variable value calculation circuit 10 may be the variable value calculation circuit 10a, 10b, or 10c. Another variable value calculation circuit 10 may be the variable value calculation circuit 10a, 10b, or 10c. In addition, another variable value calculation circuit 10 may be emulated by the CPU 401, or may be configured in hardware manner using an element which is not illustrated in the drawing.

In a case where the variable value calculation circuit 10 is partially emulated by one computer 400, an operation of an emulation target part of the variable value calculation circuit 10 is stored in the auxiliary memory device in the program form. The CPU 401 reads the program from the auxiliary memory device 402 and deploys the program in the main memory device 403, and simulates the operation of the emulation target part of the variable value calculation circuit 10 according to the program. In addition, in a case where an element which is configured using the memory, such as the latch, is included in the emulation target part, the CPU 401 secures a storage area corresponding to the element in the main memory device 403 according to the program. In addition, the CPU 401 exchanges a signal with another part through the interface 404. The variable value calculation circuit 10 may be the variable value calculation circuit 10a, 10b, or 10c.

In the configuration illustrated in FIG. 20, in addition to or instead of the CPU 401, a Graphics Processing Unit (GPU) may be used.

Processes of the respective units may be performed by recording a program for realizing the whole or a part of calculation and control performed by the solution search device 1, such as the program which emulates the above-described solution search device 1, in a computer-readable recording medium, causing a computer system to read and execute the program recorded in the recording medium. Meanwhile, it is assumed that the "computer system" referred here includes an OS or hardware such as a peripheral device.

In addition, it is assumed that the "computer system" includes homepage provision environment (or display environment) in a case where a WWW system is used.

In addition, the "computer-readable recording medium" includes a flexible disk, a magneto-optic disk, a ROM, a portable medium, such as a CD-ROM, and a storage device, such as a hard disk, embedded in the computer system. Further, it is assumed that the "computer-readable recording medium" includes a medium, which dynamically holds a program for short time as a communication line in a case where the program is transmitted through a network, such as the Internet, a communication line, such as a telephone line, or a medium which holds the program for fixed time as a volatile memory on an inside of the computer system which becomes a server or a client in that case. In addition, the program may be provided to realize a part of the above-described function or may be realized through a combination with a program which already records the above-described function in the computer system.

Hereinabove, although the embodiment of the present invention is described with reference to the accompanying drawings, a detailed configuration is not limited to the embodiment, and change of design or the like in a range without departing from the gist of the invention is included.

INDUSTRIAL APPLICABILITY

The embodiment of the present invention may be applied to the solution search device.

REFERENCE SYMBOLS 1, 1a, 1b, 1c Solution search device
10, 10a, 10b, 10c Variable value calculation circuit
20, 20a, 20b, 20c Notification path
101, 101a, 101b Positive-side variable value calculation circuit
102, 102a, 102b Negative-side variable value calculation circuit
103 Majority decision circuit
104 Variable value latch
111 Contradiction detection circuit
112 Contradiction detection-side latch
121, 121b Contradiction detection merging circuit
122 Reflection-side latch
123 Contradiction detection reflection circuit
124, 223, 223b, 315, 325 Multiplexer
131, 131-1, 131-2, 131-3 Error circuit
211, 211a, 211b Positive-side clause calculation circuit
212, 212b Positive-side product circuit
213 Positive-side latch
221, 221b Literal circuit
222 NOT circuit
224, 224a Positive-side sum circuit
231, 231a, 231b Negative-side clause calculation circuit
232, 232b Negative-side product circuit
233 Negative-side latch
244, 244a Negative-side sum circuit
311, 312, 313, 314, 321, 322, 323, 324, 331, 332, 333 Logic gate
400 Computer
401 CPU
402 Main memory device
403 Auxiliary memory device
404 Interface

The invention claimed is:

1. A solution search device comprising:
a variable value calculation circuit that is provided for each variable included in a conjunctive-normal-form logical expression of an instance of the Boolean Satisfiability problem (SAT) and calculates a value of the respective variable; and
a notification path that notifies another calculation circuit of the value of the respective variable calculated by the variable value calculation circuit,
wherein each of the variable value calculation circuits includes:
a positive-side variable value calculation circuit that calculates a value of a target variable in a case where a value of a first other variable is input to the logical expression, the target variable being the variable whose value is calculated by the variable value calculation circuit, the value calculated by the positive-side variable value calculation circuit making all clauses including a target variable having no negation among clauses of the logical expression be true,
a negative-side variable value calculation circuit that calculates the value of the target variable in a case where a value of a second other variable is input to the logical expression, the value calculated by the negative-side variable value calculation circuit making all clauses including a target variable having negation among the clauses of the logical expression be true, the second other variable being different from the first other variable, and
a current value calculation circuit that calculates the value of the target variable based on the value of the target variable calculated by the positive-side variable value calculation circuit, the value of the target variable calculated by the negative-side variable value calculation circuit, and a previous value of the target variable.

2. The solution search device according to claim 1,
wherein the positive-side variable value calculation circuit includes:
a positive-side clause calculation circuit that outputs true in a case where all literals other than a literal of the target variable are false among literals included in a clause including the target variable having no negation, among the clauses of the logical expression, and outputs false in a case where any one or more literals among the literals other than the literal of the target variable are true among the literals included in the clause including the target variable having no negation, among the clauses of the logical expression, and
a logical OR calculation circuit that calculates a logical OR of outputs of the positive-side clause calculation circuits corresponding to all the clauses including the target variable having no negation among the clauses of the logical expression.

3. The solution search device according to claim 2,
wherein the positive-side clause calculation circuit further includes:
a positive-side selection circuit that selects any one of the value of the first other variable, negation of the value of the first other variable, and true according to an aspect of a literal of a variable other than the target variable in the clause including the target variable having no negation, and
a logical NOR calculation circuit that calculates a logical NOR of outputs of all the positive-side selection circuits corresponding to all literals included in the clause including the target variable having no negation.

4. The solution search device according to claim 3,
wherein the negative-side variable value calculation circuit includes:
a negative-side clause calculation circuit that outputs false in a case where all literals other than a literal of the target variable are false among literals included in a clause including the target variable having negation among the clauses of the logical expression, and outputs true in a case where any one or more literals among the literals other than the literal of the target variable are true among the literals included in the clause including the target variable having negation among the clauses of the logical expression, and
a logical AND calculation circuit that calculates a logical AND of outputs of the negative-side clause calculation circuits corresponding to all the clauses including the target variable having negation among the clauses of the logical expression.

5. The solution search device according to claim 4,
wherein the negative-side clause calculation circuit further includes:
a negative-side selection circuit, and
a logical OR calculation circuit that calculates a logical OR of outputs of all the negative-side selection circuits corresponding to all the literals included in the clause including the target variable having negation.

6. The solution search device according to claim 2, wherein the positive-side clause calculation circuit further includes:
- a positive-side selection circuit that selects any one of the value of the second other variable, negation of the value of the second other variable, and true according to an aspect of a literal of a variable other than the target variable in the clause including the target variable having no negation, and
- a logical NOR calculation circuit that calculates a logical NOR of outputs of all the positive-side selection circuits corresponding to all literals included in the clause including the target variable having no negation.

7. The solution search device according to claim 1, further comprising:
- an error circuit that reverses true and false of at least one of:
- the value of the target variable calculated by the positive-side variable value calculation circuit, or
- the value of the target variable calculated by the negative-side variable value calculation circuit with a predetermined probability.

8. The solution search device according to claim 1, further comprising:
- a contradiction detection circuit that detects that the value of the target variable calculated by the positive-side variable value calculation circuit and the value of the target variable calculated by the negative-side variable value calculation circuit are incompatible; and
- a contradiction detection reflection circuit that reflects a detection result of another contradiction detection circuit on the calculation of the value of the target variable by the current value calculation circuit.

9. The solution search device according to claim 8, further comprising:
- an error circuit that suppresses reflection of the detection result on the calculation of the value of the target variable by the current value calculation circuit with a predetermined probability.

10. A non-transitory computer-readable recording medium storing a program which, when executed, simulates the solution search device according to claim 1.

11. A solution search device comprising:
- a variable value calculation circuit that is provided for each variable included in a conjunctive-normal-form logical expression of an instance of the Boolean Satisfiability problem (SAT) and calculates a value of the respective variable; and
- a notification path that notifies another calculation circuit of the value of the respective variable calculated by the variable value calculation circuit,
wherein each of the variable value calculation circuits includes:
- a positive-side variable value calculation circuit that calculates a value of a target variable in a case where a value of another variable is input to the logical expression, the target variable being the variable whose value is calculated by the variable value calculation circuit, the value calculated by the positive-side variable value calculation circuit making all clauses including a target variable having no negation among clauses of the logical expression be true,
- a negative-side variable value calculation circuit that calculates the value of the target variable in a case where the value of the other variable is input to the logical expression, the value calculated by the negative-side variable value calculation circuit making all clauses including a target variable having negation among the clauses of the logical expression be true, and
- a current value calculation circuit that calculates the value of the target variable based on the value of the target variable calculated by the positive-side variable value calculation circuit, the value of the target variable calculated by the negative-side variable value calculation circuit, and a previous value of the target variable.

* * * * *